United States Patent
Koepp et al.

(10) Patent No.: US 9,748,378 B2
(45) Date of Patent: Aug. 29, 2017

(54) SEMICONDUCTOR DEVICE, INTEGRATED CIRCUIT AND METHOD OF MANUFACTURING A SEMICONDUCTOR DEVICE

(71) Applicant: Infineon Technologies AG, Neubiberg (DE)

(72) Inventors: Karoline Koepp, Munich (DE); Andreas Meiser, Sauerlach (DE); Till Schloesser, Munich (DE)

(73) Assignee: Infineon Technologies AG, Neubiberg (DE)

( * ) Notice: Subject to any disclaimer, the term of this patent is extended or adjusted under 35 U.S.C. 154(b) by 22 days.

(21) Appl. No.: 14/656,041

(22) Filed: Mar. 12, 2015

(65) Prior Publication Data
US 2016/0268423 A1  Sep. 15, 2016

(51) Int. Cl.
| H01L 27/088 | (2006.01) |
| H01L 29/78 | (2006.01) |
| H01L 29/40 | (2006.01) |
| H01L 29/423 | (2006.01) |
| H01L 29/66 | (2006.01) |
| H01L 29/06 | (2006.01) |

(52) U.S. Cl.
CPC ........ H01L 29/7825 (2013.01); H01L 27/088 (2013.01); H01L 29/407 (2013.01); H01L 29/4236 (2013.01); H01L 29/66681 (2013.01); H01L 29/7813 (2013.01); H01L 29/7823 (2013.01); H01L 29/7835 (2013.01); *H01L 29/0692* (2013.01); *H01L 29/0696* (2013.01)

(58) Field of Classification Search
CPC .......................... H01L 29/7825; H01L 29/407
See application file for complete search history.

(56) References Cited

U.S. PATENT DOCUMENTS

| 2010/0102871 A1* | 4/2010 | Werner | H01L 24/03 327/534 |
| 2011/0254088 A1* | 10/2011 | Darwish | H01L 29/407 257/340 |
| 2014/0292395 A1* | 10/2014 | Wu | H01L 21/28264 327/434 |

OTHER PUBLICATIONS

Meiser, et al., "Semiconductor Device and Method of Manufacturing a Semiconductor Device", U.S. Appl. No. 13/731,380, filed Dec. 31, 2012.
Meiser, et al., "Semiconductor Device Including a Fin and a Drain Extension Region and Manufacturing Method", U.S. Appl. No. 13/692,462, filed Dec. 3, 2012.

(Continued)

*Primary Examiner* — Marc Armand
(74) *Attorney, Agent, or Firm* — Murphy, Bilak & Homiller, PLLC

(57) ABSTRACT

A semiconductor device includes a transistor in a semiconductor substrate having a first main surface. The transistor includes a source region, a drain region, a channel region, a drift zone, and a gate electrode adjacent to at least two sides of the channel region. The gate electrode is disposed in trenches extending in a first direction parallel to the first main surface. The gate electrode is electrically coupled to a gate terminal. The channel region and the drift zone are disposed along the first direction between the source region and the drain region. The semiconductor device further includes a conductive layer beneath the gate electrode and insulated from the gate electrode. The conductive layer is electrically connected to the gate terminal.

16 Claims, 21 Drawing Sheets

(56) References Cited

OTHER PUBLICATIONS

Meiser, et al., "Semiconductor Device, Integrated Circuit and Method of Manufacturing a Semiconductor Device", U.S. Appl. No. 14/027,570, filed Sep. 16, 2013.
Schloesser, et al., "Semiconductor Device and Method for Manufacturing a Semiconductor Device", U.S. Appl. No. 13/627,215, filed Sep. 26, 2012.

* cited by examiner

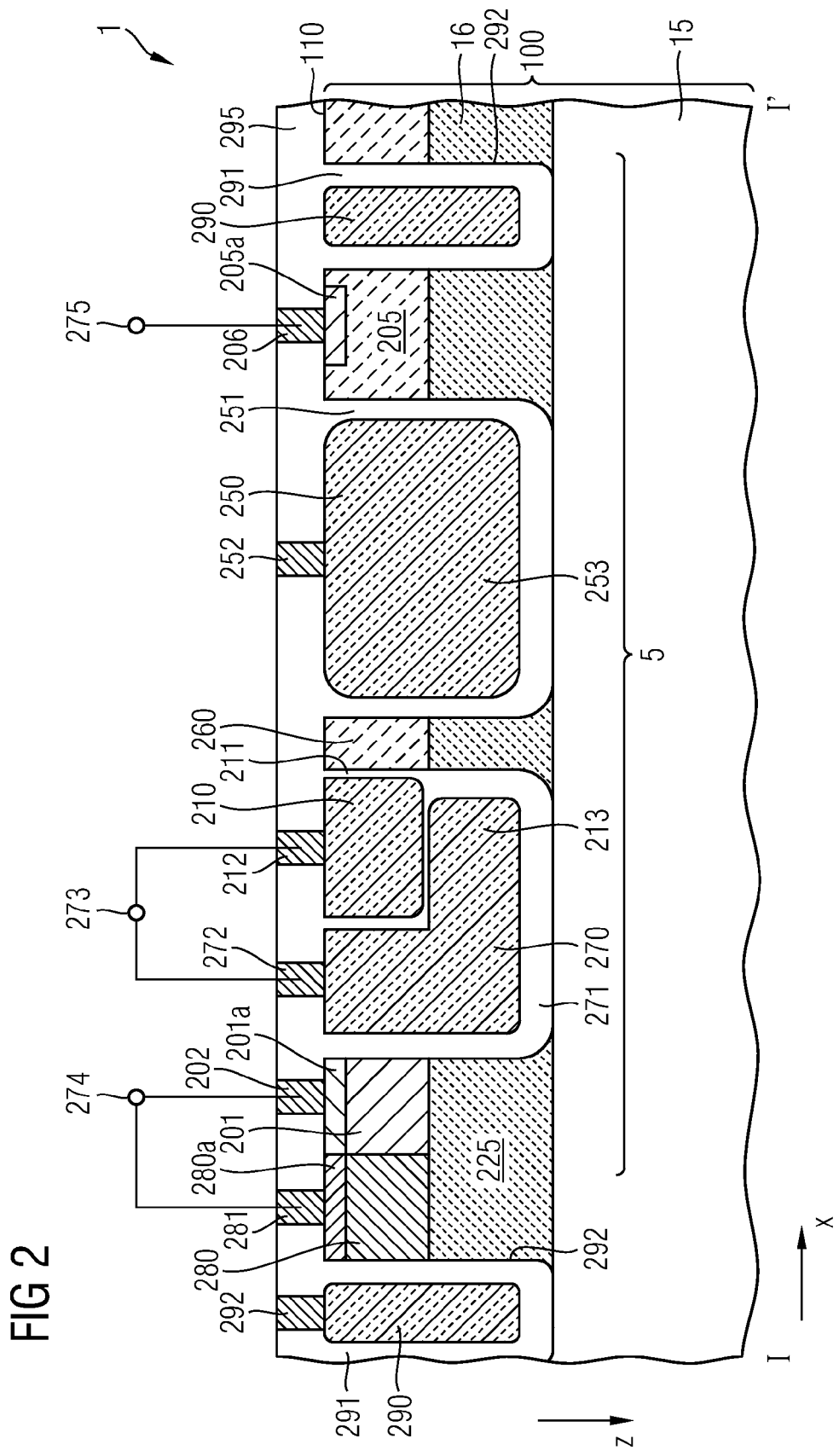

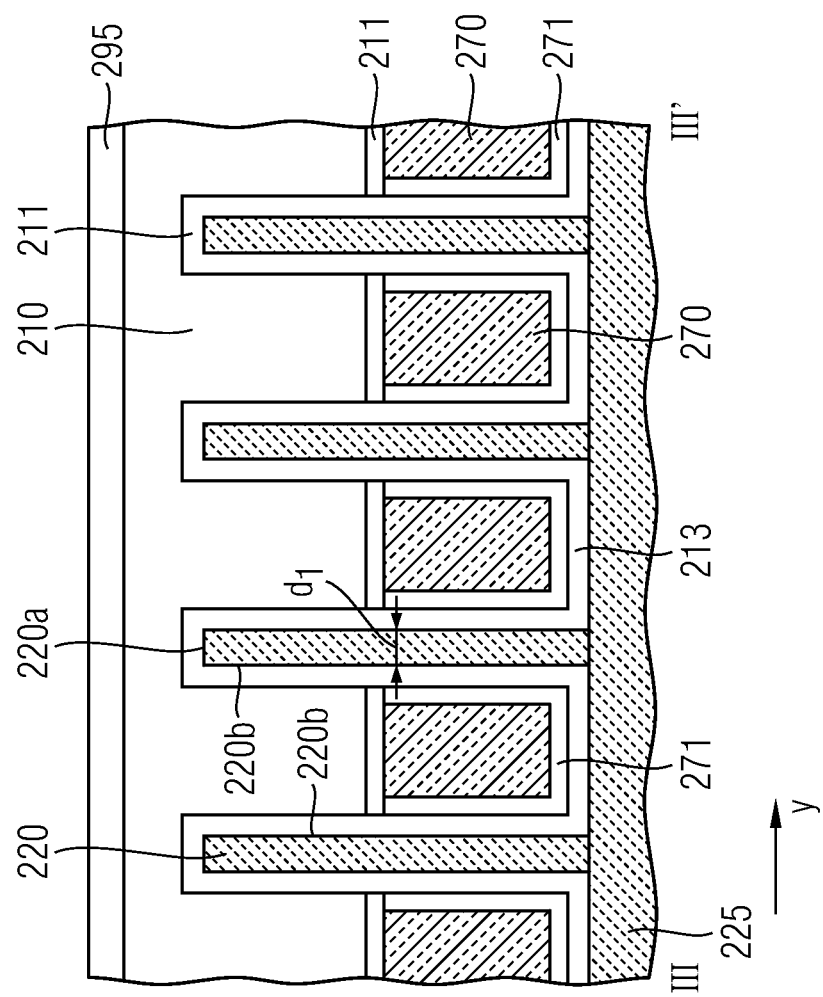

SEMICONDUCTOR DEVICE, INTEGRATED CIRCUIT AND METHOD OF MANUFACTURING A SEMICONDUCTOR DEVICE

BACKGROUND

Power transistors commonly employed in automotive and industrial electronics require a low on-state resistance ($R_{on}$), while securing a high voltage blocking capability. For example, a MOS ("metal oxide semiconductor") power transistor should be capable, depending upon application requirements to block drain to source voltages $V_{ds}$ of some tens to some hundreds or thousands of volts. MOS power transistors typically conduct very large currents which may be up to some hundreds of Amperes at typical gate-source voltages of about 2 to 20 V.

Lateral power devices, in which current flow mainly takes place parallel to a first main surface of a semiconductor substrate, are useful for integrated circuits in which further components, such as switches, bridges and control circuits are integrated.

According to existing technologies, there are integration schemes which combine processes of manufacturing a vertical power device comprising a trench with further components such as logic circuits. Generally, a field plate is disposed in a lower portion of the trench, and a gate electrode is disposed in an upper portion of the trench. In such vertical power devices, a current flow mainly takes place perpendicularly with respect to the first main surface of the semiconductor substrate.

There is need of developing further lateral transistor concepts which may be manufactured utilizing known integration schemes.

SUMMARY

According to an embodiment, a semiconductor device comprises a transistor in a semiconductor substrate having a first main surface. The transistor comprises a source region, a drain region, a channel region, a drift zone, and a gate electrode adjacent to at least two sides of the channel region. The gate electrode is disposed in gate trenches extending in a first direction parallel to the first main surface. The gate electrode is electrically coupled to a gate terminal, the channel region and the drift zone being disposed along the first direction between the source region and the drain region. The semiconductor device further comprises a conductive layer beneath the gate electrode and insulated from the gate electrode, the conductive layer being electrically connected to the gate terminal.

According to an embodiment, a semiconductor device comprises a transistor in a semiconductor substrate having a first main surface. The transistor comprises a source region, a drain region, a channel region, a drift zone, and a gate electrode adjacent to at least two sides of the channel region. The transistor further comprises a field plate adjacent to at least two sides of the drift zone, the gate electrode being disposed in trenches extending in a first direction parallel to the first main surface. The channel region and the drift zone are disposed along the first direction between the source region and the drain region. The semiconductor device further comprises a conductive layer beneath the gate electrode and insulated from the gate electrode, the conductive layer being electrically connected to the field plate.

According to an embodiment, a semiconductor device comprises a transistor in a semiconductor substrate having a first main surface. The transistor comprises a source region, a drain region, a channel region, a drift zone, and a gate electrode adjacent to at least two sides of the channel region. The gate electrode is electrically connected to a gate terminal, the channel region and the drift zone being disposed along a first direction parallel to the first main surface, between the source region and the drain region. The semiconductor device further comprises a conductive layer beneath the gate electrode and insulated from the gate electrode, the gate electrode and the conductive layer being disposed in gate trenches extending in the first direction. The conductive layer is disconnected from the gate terminal and from the source terminal.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIG. 2 shows a cross-sectional view of the semiconductor device illustrated in FIG. 1;

FIGS. 3A and 3B illustrate further cross-sectional views of the semiconductor device shown in FIG. 1;

DETAILED DESCRIPTION

Figure 1:
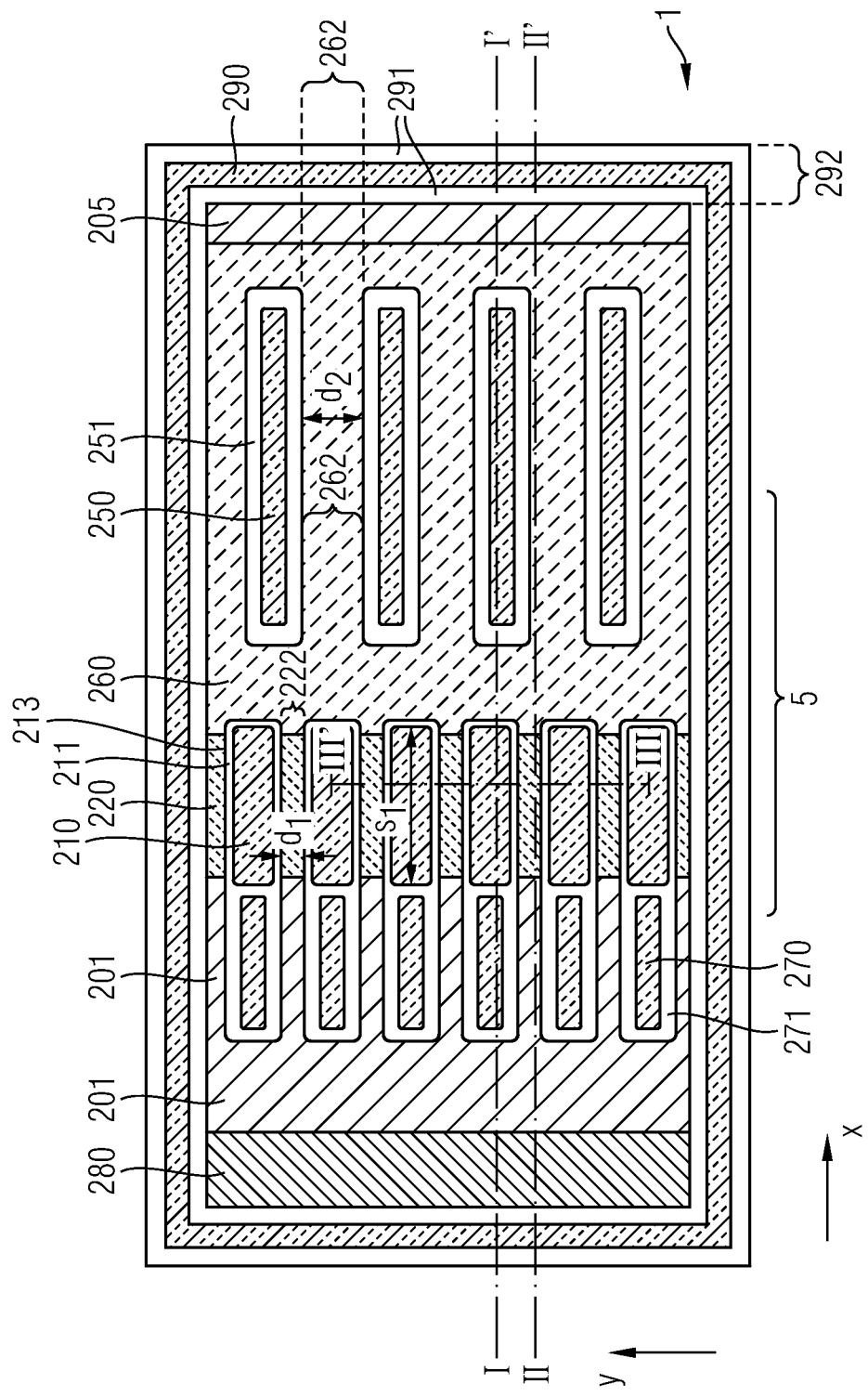
FIG. 1 shows a horizontal cross-sectional view of a semiconductor device according to an embodiment.

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

The terms "lateral" and "horizontal" as used in this specification intend to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The Figures and the description illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

FIG. 1 shows a horizontal cross-sectional view of a semiconductor device 1 according to an embodiment. The cross-sectional view of FIG. 1 is taken along a plane that is parallel to a first main surface of a semiconductor substrate. The semiconductor device 1 shown in FIG. 1 comprises a source region 201, a drain region 205, a channel region 220, and a drift zone 260. The source region 201, the drain region 205, and the drift zone 260 may be doped with dopants of a first conductivity type, for example n-type dopants. The doping concentration of the source and drain regions 201, 205 may be higher than the doping concentration of the drift zone 260. The channel region 220 is arranged between the source region 201 and the drift zone 260. The channel region 220 is doped with dopants of a second conductivity type, for example, p-type dopants. Stripe-shaped source regions 201 and stripe-shaped channel regions 220 are disposed between adjacent gate trenches 213. The gate trenches 213 are formed in the first main surface of the semiconductor substrate and extend in a first direction (e.g. the x-direction) parallel to a first main surface of the semiconductor substrate. The gate electrode 210 is disposed in the gate trenches 213 so as to be adjacent to the channel region 220. Further, a portion of a conductive material 270 is disposed in the gate trenches, the conductive material 270 being insulated from the gate electrode 210 by a dielectric layer 271. The conductive material 270 at the first main surface of the semiconductor substrate is disposed adjacent to stripe-shaped source regions 201. The drift zone 260 may be arranged between the channel region 220 and the drain region 205. The source region 201, the channel region 220, the drift zone 260 and the drain region 205 are disposed along the first direction.

When a suitable voltage is applied to the gate electrode 210, the conductivity of a channel that is formed in the channel region 220 is controlled by the gate voltage. The gate electrode 210 is insulated from the channel region 220 by means of an insulating gate dielectric material 211 such as silicon oxide. By controlling the conductivity of the channel formed in the channel region 220, a current flow from the source region 201 via the channel formed in the channel region 220 and the drift zone 260 to the drain region 205 may be controlled. According to an embodiment, the transistor may further comprise a field plate 250 which is arranged adjacent to the drift zone 260. The field plate 250 is insulated from the drift zone 260 by means of an insulating field dielectric layer 251 such as silicon oxide. The field plate 250 is disposed adjacent to the first main surface of the semiconductor substrate.

As has been mentioned above, when the transistor is switched on, an inversion layer is formed at the boundary between the channel region 220 and the insulating gate dielectric material 211. Accordingly, the transistor is in a conducting state from the source region 201 to the drain region 205 via the drift zone 260. When the transistor is switched off, no conductive channel is formed at the boundary between the channel region 220 and the insulating gate dielectric material 211 so that no current flows. Further, an appropriate voltage may be applied to the field plate 250 in an off-state. In an off-state, the field plate 250 depletes charge carriers from the drift zone 260 so that the breakdown voltage characteristics of the semiconductor device 1 are improved. In a semiconductor device 1 comprising a field plate 250, the doping concentration of the drift zone 260 may be increased without deteriorating the breakdown voltage characteristics in comparison to a device without a field plate. Due to the higher doping concentration of the drift zone 260, the on-resistance $Rds_{on}$ is further decreased resulting in improved device characteristics. The semiconductor device 1 may further comprise a body contact portion 280 which may be doped with dopants of the second conductivity type. Further, the semiconductor device 1 comprises an isolation trench 292 that surrounds the array of lateral transistors. An insulating material 291 is disposed at the sidewalls of the isolation trench 292. Further, a conductive filling 290 is disposed within the isolation trench 292.

In the semiconductor device 1 shown in FIG. 1 a current flow mainly takes place in the first direction, i.e. in a direction parallel to the first main surface. The transistor may implement a field effect transistor.

FIG. 2 illustrates a cross-sectional view of the semiconductor device 1 along the line labelled I and I' in FIG. 1. The cross-sectional view of FIG. 2 is taken so as to intersect the gate electrode 210 and the field plate 250. The semiconductor device 1 is formed in a semiconductor substrate 100 comprising a base layer 15 which may be, for example, doped with the first conductivity type, for example $n^+$. The base layer 15 may comprise a region of the first conductivity type at a lower doping concentration. This region may be disposed adjacent to a layer 16 of the substrate material doped with dopants of the second conductivity type. The layer 16 may be disposed over the base layer 15. Correspondingly doped substrate portions and wells are formed so as to provide the source region 201 including a heavily doped region 201a that is in contact with the source electrode 202. Further, the body contact portion 280 comprises a heavily doped region 280a that is in contact with the body contact plug 281. The body contact portion 280 connects the channel region 220 via a doped portion 225 (generally also referred to as body contact portion) to an appropriate potential such as the source potential so as to avoid a parasitic bipolar transistor which could be otherwise formed at this portion. The doped portion 225 is a part of the layer 16 of the substrate material doped with dopants of the second conductivity type. As is shown in FIG. 1, the body contact portion 280 extends in a third direction (e.g. the y-direction) which is parallel to the first main surface 110 and perpendicularly with respect to the first direction. Likewise, the source region 201 extends along the third direction. The drain region 205 is disposed adjacent to the drift zone 260. The drain region 205 and the drift zone 260 may be formed of one single layer portion. The drain region 205 may also be doped at a higher doping concentration than the drift zone 260. The drain region may be electrically connected to a drain electrode 206 by means of a heavily doped contact portion 205a. The source electrode 202 and the body contact plug 281 may be electrically coupled to a source terminal 274, and the drain electrode 206 may be electrically coupled to a drain terminal 275.

The gate electrode 210 is disposed in a gate trench 213. The gate trench 213 is disposed in the first main surface 110 of the semiconductor substrate 100 and may extend in the z-direction until a bottom side of the layer 16. The gate electrode 210 may be electrically connected to a gate terminal 273. A conductive material 270 is disposed in the gate trenches 213. A portion of the conductive material 270 is disposed in the semiconductor substrate 100 beneath the gate electrode 210 and is insulated from the gate electrode 210 by the insulating material 211 and from the surrounding semiconductor material by insulating material 271. According to an embodiment, a portion of the conductive layer 270 is disposed adjacent to the first main surface 110. The conductive layer 270 is coupled via a connection plug 272 to an appropriate potential. Thereby, a parasitic MOS transistor may be avoided which otherwise could be formed at this position. For example, the conductive layer 270 may be coupled to the gate terminal 273.

The semiconductor device may further comprise a field plate 250 adjacent to the drift zone 260. For example, the field plate 250 may be disposed in a field plate trench 253 which may extend from the first main surface 110 to the same depth as the gate electrode trench 213. The field plate trench 253 may extend in the first direction. The field plate 250 may be adjacent to the first main surface 110. The isolation trench 292 may extend to the same depth as the gate trench 213 and the field plate trench 253. The material 290 filled in the isolation trench 292 may be the same material as the material of the field plate 250 and the material 270 that is disposed in the semiconductor substrate 100 beneath the gate electrode 210.

As is further indicated in FIG. 1, a pitch between adjacent gate trenches 213 may be different from a pitch between adjacent field plate trenches 253. Generally, the pitch denotes the sum of a width of the gate trenches and the distance between adjacent gate trenches or the sum of a width of the field plate trenches and the distance between adjacent field plate trenches.

The source region 201 and the drain region 205 are disposed at the first main surface 110. The source region 201 may extend into a depth direction (e.g. the z-direction) of the substrate. For example, the source region 201 may extend approximately to the depth of the gate trench 213. The drain region 205 may extend into a depth direction (e.g. the z-direction) of the substrate. For example, the drain region 205 may extend approximately to the depth of the gate trench 213 or the field plate trench 253.

Figure 3A:
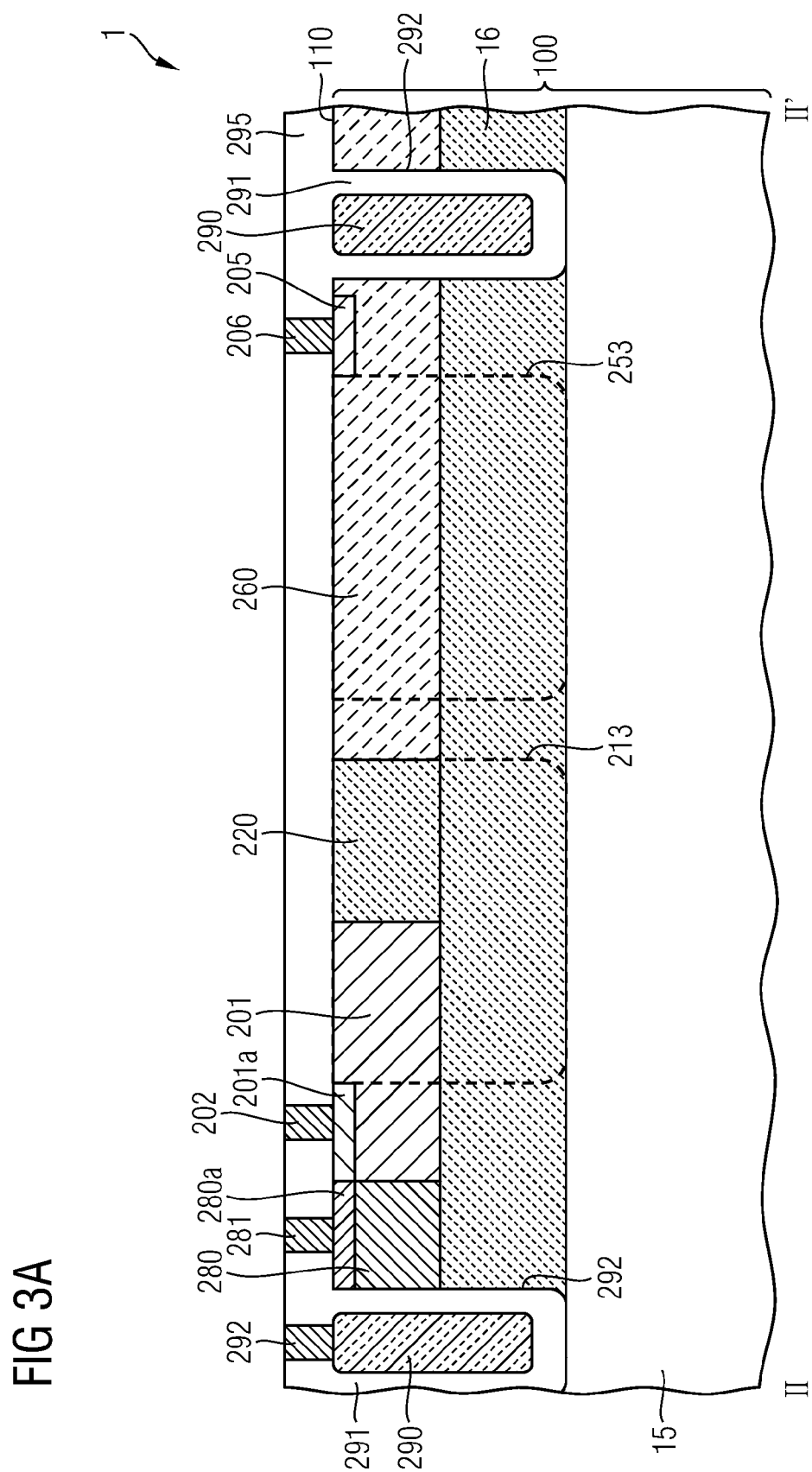

FIG. 3A shows a further cross-sectional view of the semiconductor device along the line labelled II and II' in FIG. 1. The cross-sectional view of FIG. 3A is taken so as to intersect the channel region 220 and the drift zone 260.

A portion of the source region 201 is disposed between adjacent gate trenches 213 (indicated by broken lines). The channel region 220 is disposed between adjacent portions of the gate electrode 210. The channel region 220 comprises a doped substrate portion that is doped with the second conductivity type. The drift zone 260 is disposed between adjacent field plate trenches 253 (indicated by broken lines).

FIG. 3B shows a cross-sectional view of the semiconductor device along the line labelled III and III' in FIG. 1, in a direction that is perpendicular with respect to the direction between I and I' or II and II', respectively. As is shown in FIG. 3B, the channel region 220 has the shape of a ridge, the ridge having a width d1. In other words, the channel region is patterned into the shape of a first ridge by adjacent gate trenches 213. For example, the ridge may have a top side 220a and two sidewalls 220b. The sidewalls 220b may extend perpendicularly or at an angle of more than 75° with respect to the first main surface 110. According to the embodiment shown in FIG. 3B, the gate electrode 210 may be disposed adjacent to at least two sides of the ridge. Further, the gate electrode 210 may also be adjacent to the top side 220a of the ridge. According to another embodiment, the gate electrode 210 may be adjacent to only two sidewalls 220b of the ridge. As is further illustrated in FIG. 3B, the conductive material 270 is disposed in a lower portion of the gate trenches 213. A lower portion of the gate trenches is filled with the conductive layer 270.

As has been discussed with reference to FIGS. 1 to 3B, a semiconductor device 1 comprises a transistor 5 formed in a semiconductor substrate 100 having a first main surface 110. The transistor 5 comprises a source region 201, a drain region 205, a channel region 220, a drift zone 260, and a gate electrode 210 adjacent to at least two sides of the channel region. The gate electrode 210 is disposed in gate trenches 213 extending in a first direction parallel to the first main surface. The channel region 220 and the drift zone 260 are disposed along the first direction between the source region 201 and the drain region 205. The semiconductor device further comprises a conductive layer 270 beneath the gate electrode and insulated from the gate electrode. The conductive layer 270 is electrically coupled to the gate terminal.

A portion of the conductive layer 270 is disposed adjacent to the first main surface. For example, the conductive layer 270 may be disposed in the gate trenches 213 and partially enclose the gate electrode 210. According to a further embodiment, the semiconductor device 1 may comprise a field plate 250 that is arranged adjacent to the drift zone 260.

As has been explained in the foregoing, the channel region 220 has a shape of a first ridge 222 that extends in the first direction. According to an embodiment, also the drift zone 260 may have a shape of a second ridge extending along the first direction. As is illustrated in FIG. 1, the second ridge 262 may have a width d2 that is different from the width d1 of the first ridge 222. According to a further embodiment, the width of the second ridge may be equal to the width of the first ridge.

According to an embodiment, the width $d_1$ of the channel region 220 is $d_1 \leq 2 \times l_d$, wherein $l_d$ denotes a length of a depletion zone which is formed at the interface between the gate dielectric 211 and the channel region 220. For example, the width of the depletion zone may be determined as:

$$l_d = \sqrt{\frac{4\varepsilon_s kT \ln(N_A/n_i)}{q^2 N_A}}$$

where $\varepsilon_s$ denotes the permittivity of the semiconductor material ($11.9 \times \varepsilon_0$ for silicon, $\varepsilon_0 = 8.85 \times 10^{-14}$ F/cm), k denotes the Boltzmann constant ($1.38066 \times 10^{-23}$ J/k), T denotes the temperature, ln the denotes the natural logarithm, $N_A$ denotes the impurity concentration of the semiconductor body, $n_i$ denotes the intrinsic carrier concentration ($1.45 \times 10^{10}$ cm$^{-3}$ for silicon at 27° C.), and q denotes the elementary charge ($1.6 \times 10^{-19}$ C).

Generally, the length of the depletion zone varies depending from the gate voltage. It is assumed that in a transistor the length of the depletion zone at a gate voltage corresponding to the threshold voltage corresponds to the maximum width of the depletion zone. For example, the width of the first ridges may be approximately 20 to 130 nm, for example, 40 to 120 nm along the first main surface 110 of the semiconductor substrate 100.

Moreover, the ratio of length to width may fulfil the following relationship: $s_1/d_1 > 2.0$, where $s_1$ denotes the length of the first ridge in contact with the gate electrode 210, or, differently stated, the length of the channel region, measured along the first direction, as is also illustrated in FIG. 1. According to further embodiments, $s_1/d_1 > 2.5$. According to a further embodiment, the drift zone 260 may comprise a flat surface which is not patterned to form ridges.

According to the embodiment in which the width $d_1 \leq 2 \times l_d$, the transistor 5 is a so-called "fully-depleted" transistor in which the channel region 220 is fully depleted when the gate electrode 210 is set to an on-voltage. In such a transistor, an optimal sub-threshold voltage can be achieved and short channel effects may be efficiently suppressed, resulting in improved device characteristics.

According to a further embodiment, the width d1 may be larger than $2 \times l_d$, and the transistor 5 may be operated as a transistor having an increased channel width in comparison to planar transistors.

In a transistor including a field plate 250, on the other hand, it is desirable to use a drift zone 260 having a width d2 which is much larger than the width d1. Due to the larger width of the drift zone d2, the resistance $Rds_{on}$ of the drift zone 260 may be further decreased, resulting in further improve device characteristics. In order to improve the characteristics of the semiconductor device in the body region and to further improve the device characteristics in the drift zone, patterning the gate electrode and the field plate may be accomplished using an appropriate etching mask so as to provide a different width of the first and second ridges.

As will be discussed particularly with reference to FIGS. 5A to 5H, the semiconductor device shown in FIGS. 1 to 3B may be manufactured by an integration scheme for manufacturing a vertical power transistor, i.e. a power transistor in which the field plate 250 and the gate electrode 210 are implemented by two different conductive layers that are disposed in a trench that is formed in the first main surface 110 of the semiconductor substrate 100. In such a vertical power transistor, the source region and the drain region are disposed at opposite main surfaces of the semiconductor substrate 100.

Figure 4A:
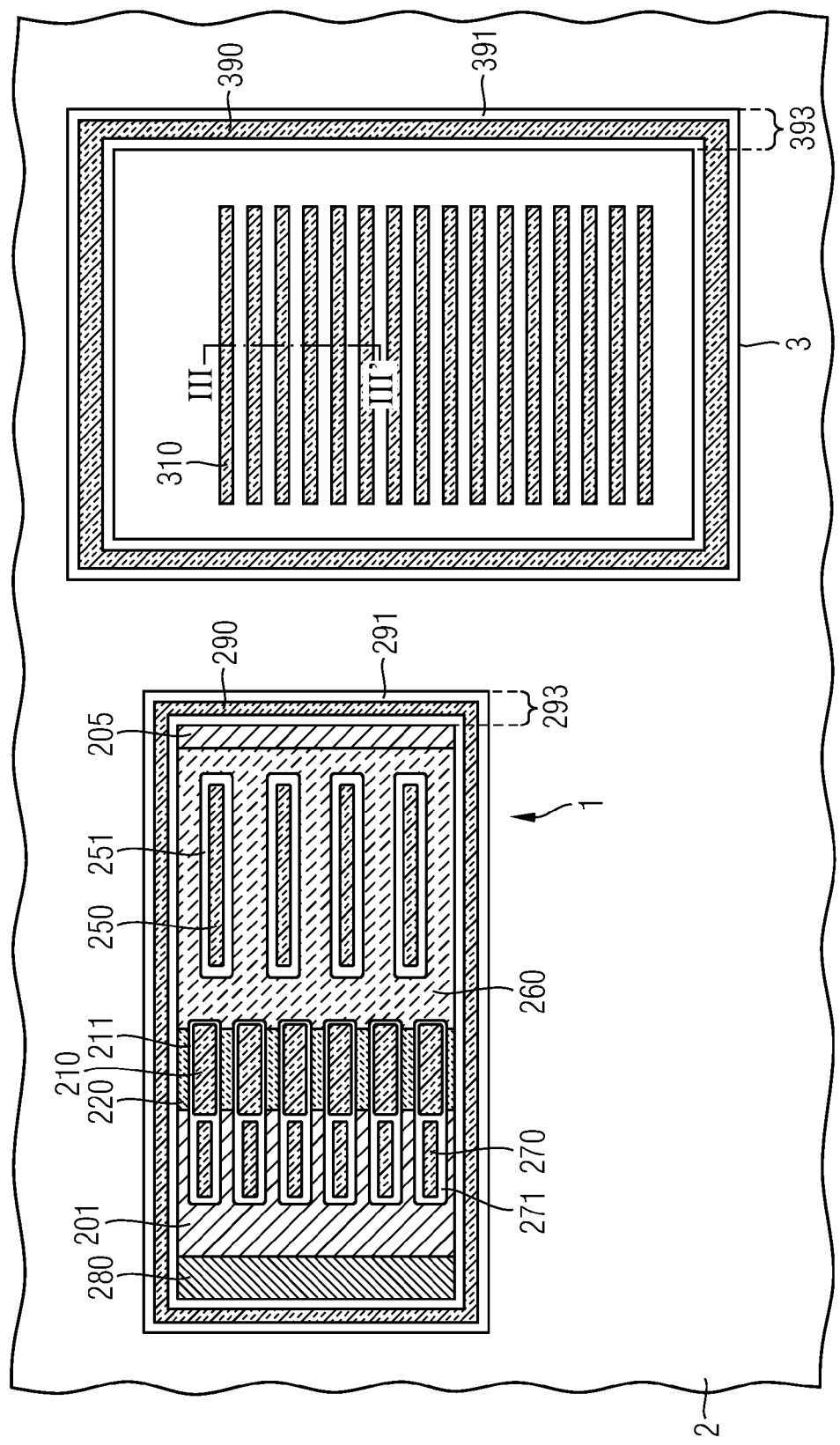
FIG. 4A shows a horizontal cross-sectional view of an integrated circuit according to an embodiment.

FIG. 4A shows a horizontal cross-sectional view of an integrated circuit according to an embodiment. The cross-sectional view of FIG. 4A is taken in a plane parallel to the first main surface of the semiconductor substrate. As is shown, an integrated circuit 2 according to an embodiment comprises a semiconductor device 1 as has been described herein above with reference to FIGS. 1 to 3B. Further, the integrated circuit 2 includes a second semiconductor device 3 including vertical power transistors, e.g. field effect transistors. As is specifically illustrated in FIG. 4A, the second semiconductor device 3 comprises a plurality of gate trenches 310 that run in a direction parallel to the first main surface of the semiconductor substrate. The semiconductor device 3 may further comprise an isolation trench 393 that encloses the array of gate trenches 310. An insulating layer 391 is disposed at sidewalls of the isolation trench 393. Further, a conductive filling 390 is disposed in the isolation trenches 393.

Figure 4B:
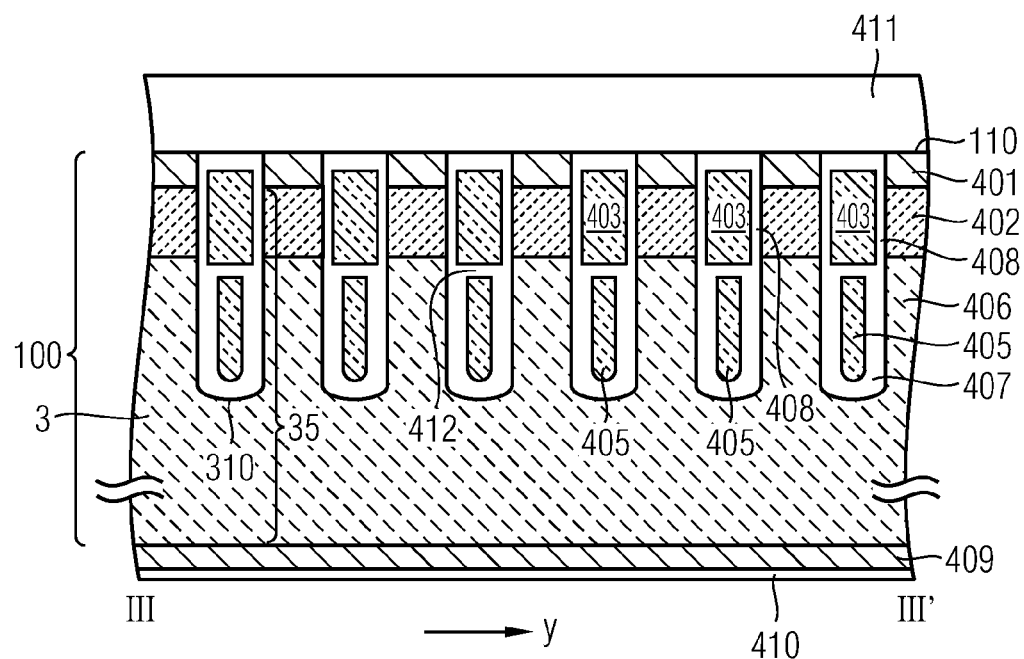
FIG. 4B shows a cross-sectional view of a portion of the integrated circuit shown in FIG. 4A.

FIG. 4B shows a cross-sectional view of the second semiconductor device 3 along the line labelled III and III' in FIG. 4A. The semiconductor device 3 comprises a plurality of vertical transistors 35 that may be connected in parallel. Each of the vertical transistors 35 includes a gate trench 310 formed in the first main surface 110 of the semiconductor substrate 100. The semiconductor device 3 includes a source region 401 that is disposed adjacent to the first main surface 110 and a drain region 409 that is disposed on a back side of the semiconductor substrate 100. A drain electrode 410 is disposed adjacent to the drain region 409. Further, the semiconductor device 3 comprises a channel region 402 and a drift zone 406 that are disposed between the source region 401 and the drain region 409 in a second direction (e.g. the z-direction) that is perpendicular with respect to the first main surface 110. A field plate 405 is disposed in a lower portion of the gate trenches 310. Further, a gate electrode 403 is disposed in an upper portion of the gate trench 310 adjacent to the channel region 402. The gate electrode 403 is insulated from the channel region 402 by means of a gate dielectric 408. Further, the field plate 405 is insulated from the drift zone 406 by means of a field dielectric layer 407. The gate electrode 403 is insulated from the field plate 405 by an insulating layer 412.

When an appropriate voltage is applied to the gate electrode 403, a conductive channel is formed at an interface between the channel region 402 and the gate dielectric layer 408. Accordingly, the gate voltage controls the current flow between source region 401 and drain region 409. When the transistor is switched off, no conductive channel is formed at the interface between the channel region 402 and the gate dielectric layer 408. Further, due to the presence of the field plate 405, charge carriers are depleted from the drift zone 406 so that the resulting transistor may withstand comparatively high voltages. According to an embodiment, both types of transistors, i.e. the lateral transistor 5 and the vertical transistor 35 may be integrated in a single semiconductor substrate 100. Further, both semiconductor devices may be formed by joint processing processes. For example, using different masks for the first semiconductor device 1 and the second semiconductor device 3, the respective components may be processed.

FIGS. 5A to 5H illustrate steps of manufacturing the semiconductor device 1 or the integrated circuit 2. FIGS. 5A to 5H specifically illustrate cross-sectional views along the line labelled I and I' in FIG. 1.

Figure 5A:
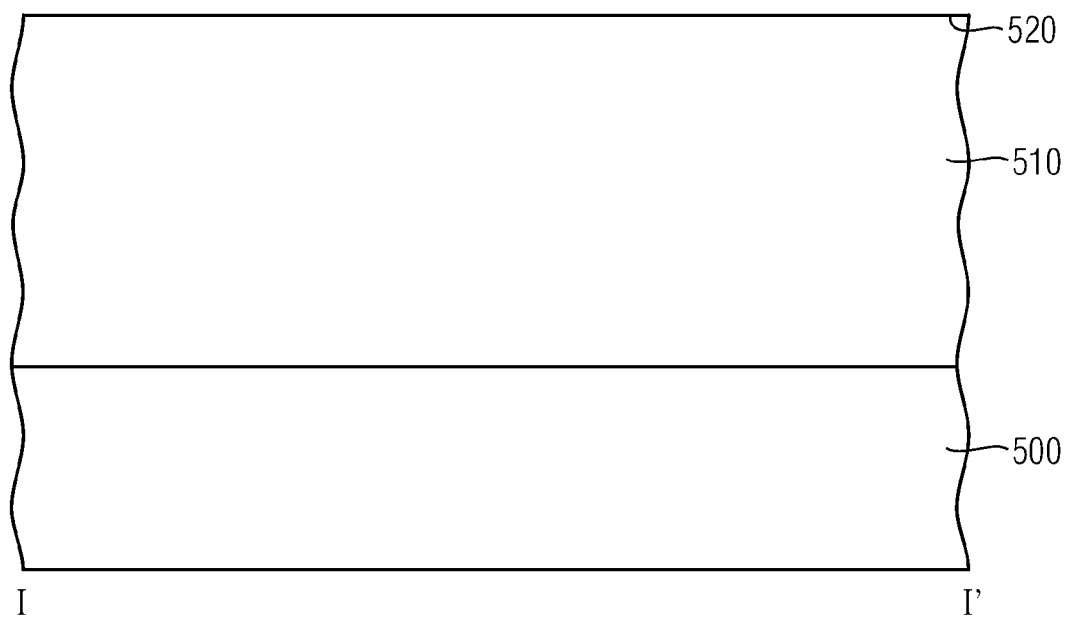
FIGS. 5A to 5H illustrate cross-sectional views and corresponding masks for illustrating a method for manufacturing a semiconductor device.

A starting point for performing the method according to an embodiment may be a heavily doped wafer doped with dopants of the first conductivity type, for example, an n$^+$ semiconductor wafer 500. A semiconductor layer 510 of the first conductivity type, being doped at a lower doping concentration than the wafer 500, for example, an n$^-$ layer is epitaxially grown over the semiconductor wafer 500. FIG. 5A shows a cross-sectional view of an example of a resulting structure. The surface of the semiconductor layer 510 forms the first main surface 520 of the resulting substrate.

Thereafter, several doping processes may be performed so as to provide well implanted portions. For example, these well implanted portions may define components of the first and second semiconductor devices 1, 3. Further, the implanted well portions may implement components of logic circuits which are to be formed in later or parallel processes.

Figure 5B:
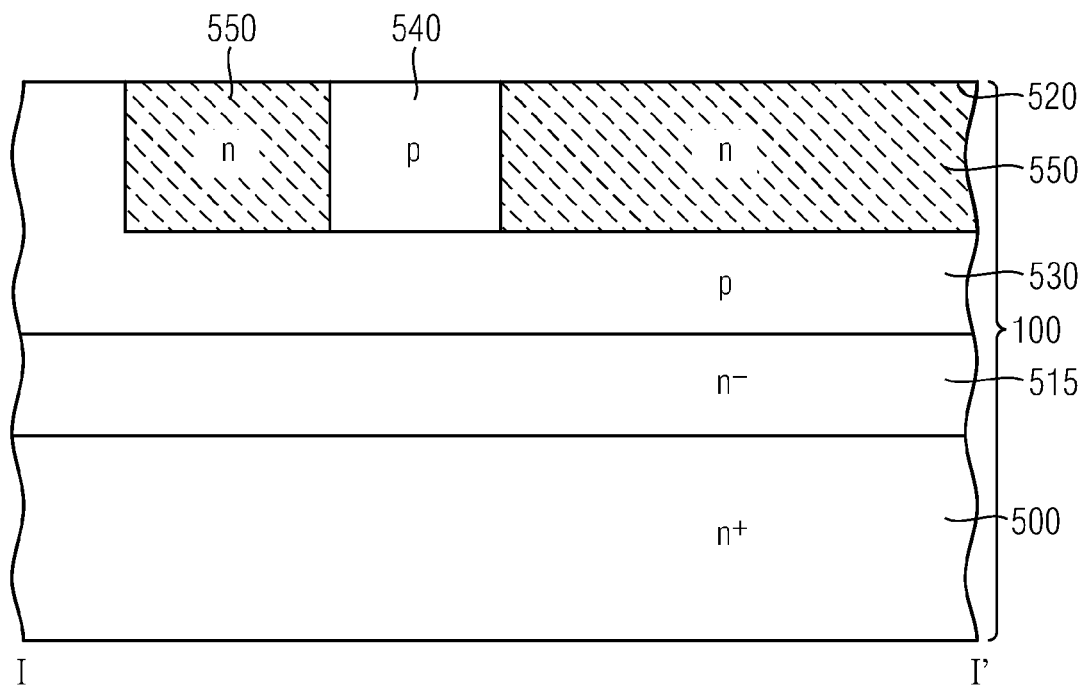

FIG. 5B shows an example of a resulting structure. As is shown in FIG. 5B, a layer 530 doped with dopants of the second conductivity type is disposed over a portion 515 of the semiconductor layer 510 of the first conductivity type that is doped with a lower doping concentration. Further, portions 550 of the first conductivity type are disposed adjacent to the first main surface 520. The layer 530 provides a vertical isolation between the portion 515 and the portion 550 of the first conductivity type. In addition, portions 540 of the second conductivity type are disposed adjacent to the first main surface 520.

Figure 5C:
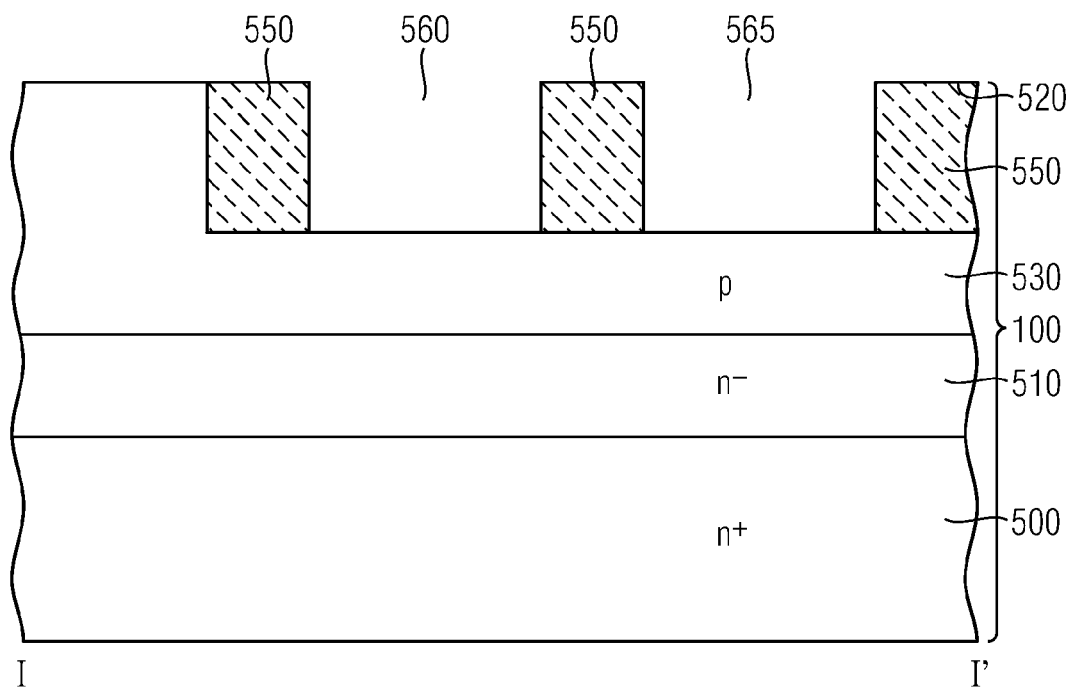

Thereafter, etching processes may be performed. According to an embodiment of a method of manufacturing an integrated circuit, masks may be employed for correspondingly processing components of the second semiconductor device 3. For example, the mask 570 shown in FIG. 5D may be used for forming trenches 560, 565 in the first main surface 520 of the substrate 100 as shown in FIG. 5C in order to form the gate electrode 210 and the field plate 250. Further, although not explicitly shown in FIGS. 5C and 5D, the mask 570 may comprise openings for forming the isolation trenches 293. The mask 570 shown in FIG. 5D comprises openings 574 for defining the gate trenches 560 and openings 572 for defining the field plate trenches 565.

Figure 5D:
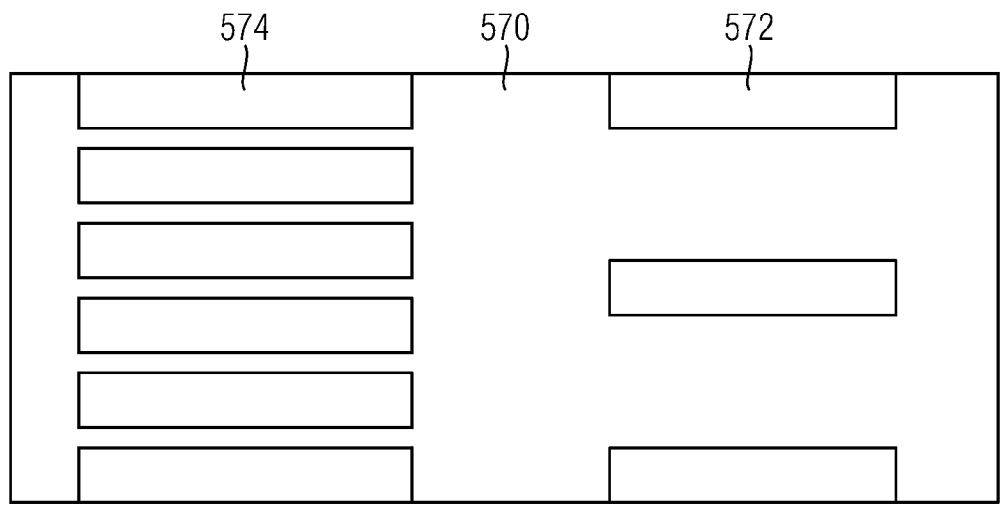

Using the mask 570 shown in FIG. 5D, an etching process is performed so as to form the trenches 560, 565. Thereafter, an insulating layer may be deposited, followed by the deposition of a conductive layer.

Figure 5E:
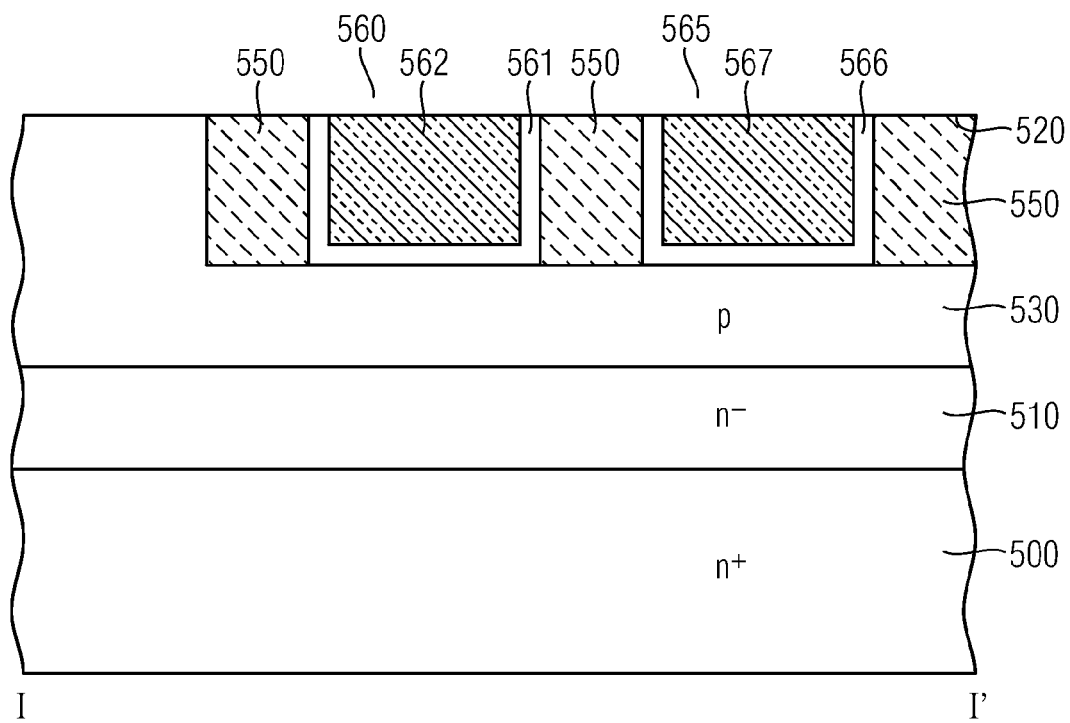

For example, as is also illustrated in FIG. 5E, a first insulating layer 561 may be formed in the first trench 560 and a second insulating layer 566 may be formed in the second trench 565. Further, a first conductive layer 562 may be formed in the first trench 560, and a second conductive layer 567 may be formed in the second trench 565. In a similar manner, an insulating layer and a conductive layer may be formed in the isolation trenches (not shown). The processes of forming the insulating layers 561, 566 and the conductive layers 562, 567 may be processing steps which form the field dielectric layer 407 and the field plate 405 shown in FIG. 4B, for example.

Figure 5F:
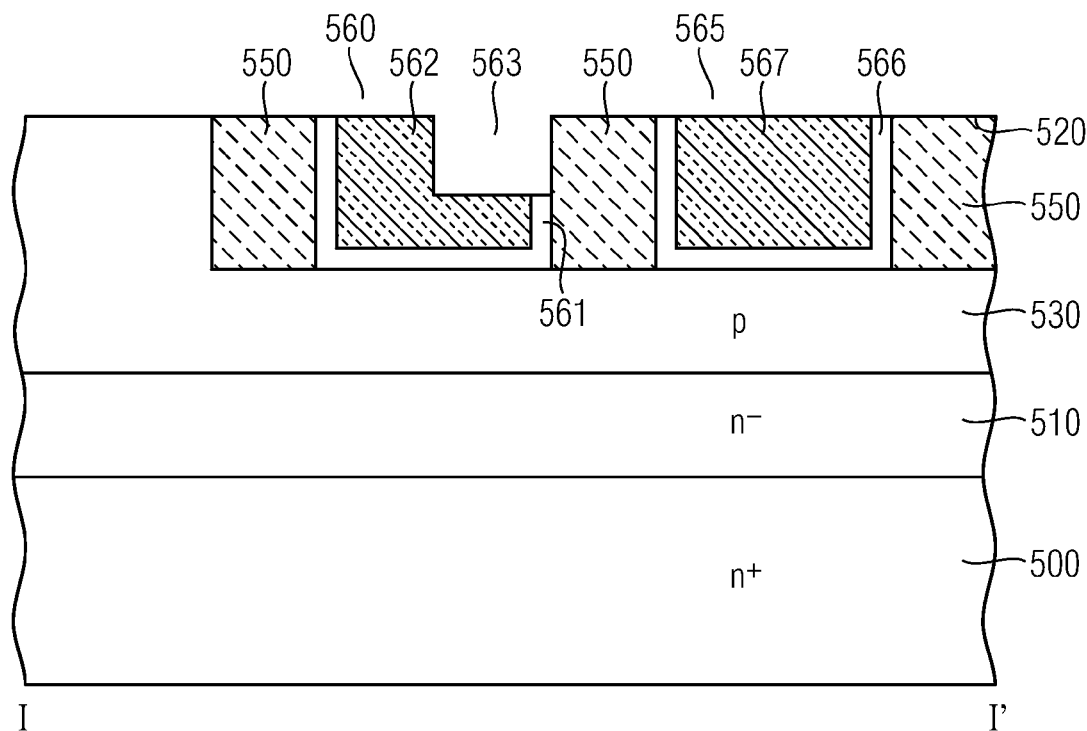
Figure 5G:
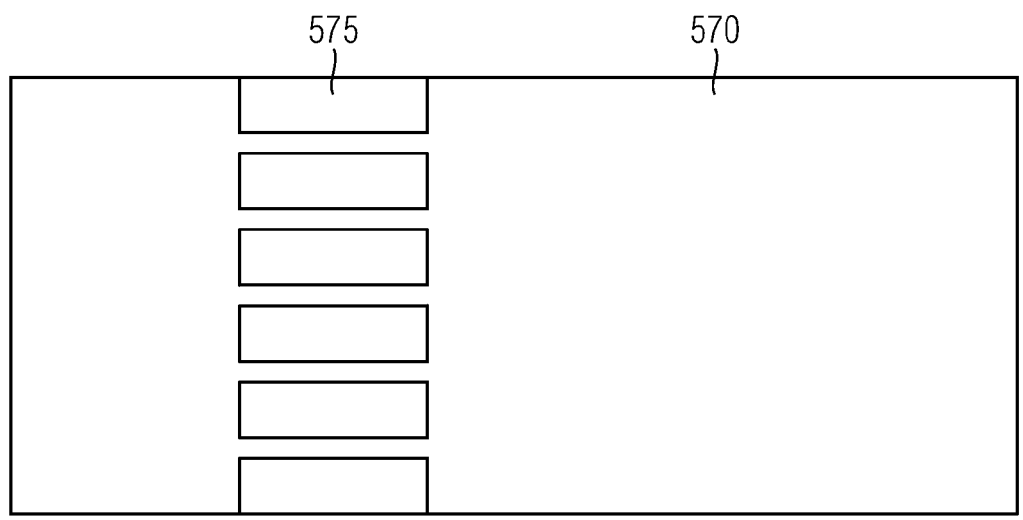

Thereafter, a further etching process is performed using the mask 570 that is, for example, shown in FIG. 5G. As is shown, the mask 570 shown in FIG. 5G comprises openings 575 which define the positions of the gate electrodes 210.

Figure 5H:
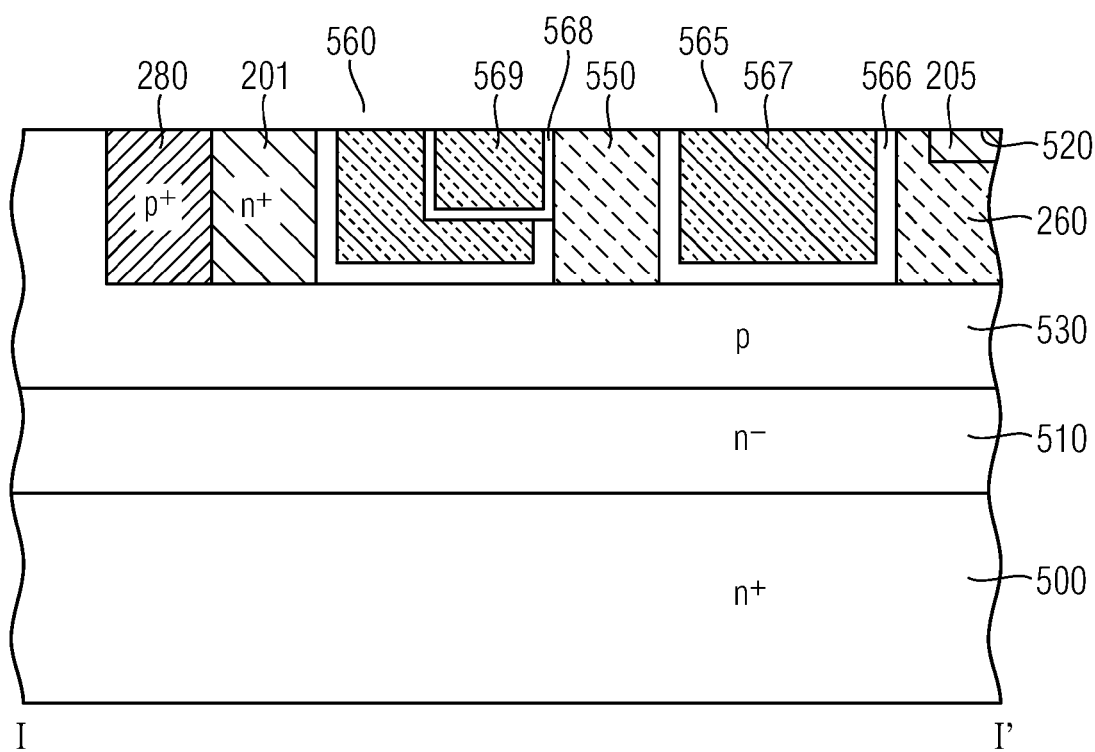

FIG. 5F shows an example of a resulting structure after performing a corresponding etching process. As is shown, a recess 563 is formed in the conductive layer 562 and the insulating layer 561. The recess 563 is formed at positions defined by the openings 575 in the mask 570. Thereafter, a further process of forming an insulating layer followed by a conductive layer 569 is performed. Due to this processing step, a thin insulating layer 568 is formed on the sidewalls and the bottom side of the recess 563, followed by a conductive filling 569. For example, this process may also form the gate dielectric layer 408 and the gate electrode 403 of the vertical transistor 35 illustrated in FIG. 4B. Further, doping processes may be performed in order to provide heavily doped portions of the source and drain regions 201, 205. FIG. 5H shows an example of a resulting structure.

Thereafter, further processing steps may be performed so as to provide further components of the first semiconductor device 1 and the second semiconductor device 3. For example, further insulating layers may be formed, followed by forming respective contacts to the components of the first and second semiconductor devices 1, 3.

Figure 6:
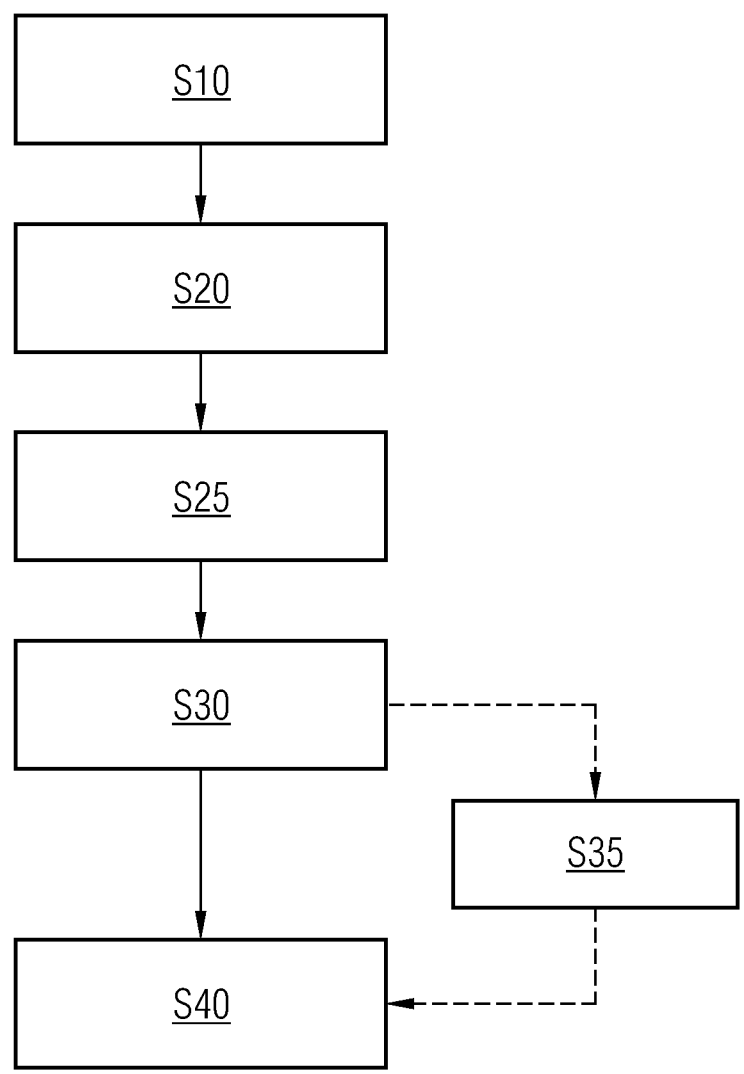
FIG. 6 summarized a method for manufacturing a semiconductor device.

FIG. 6 summarizes elements of the method of manufacturing a semiconductor device according to an embodiment. As is shown in FIG. 6, a method of manufacturing a semiconductor device includes forming a transistor in a semiconductor substrate having a first main surface. Forming the transistor comprises: forming a source region (S40); forming a drain region (S40); forming a channel region (S10); forming a drift zone (S20); and forming a gate electrode (S30) in trenches extending in a first direction parallel to the first main surface adjacent to at least two sides of the channel region, the channel region and the drift zone being disposed along the first direction between the source region and the drain region. Forming the semiconductor device further includes forming a conductive layer (S25), a portion of the conductive layer being disposed in the semiconductor substrate beneath the gate electrode and being insulated from the gate electrode.

According to an embodiment, the method may further comprise forming trenches in the first main surface. Forming the conductive layer may comprise forming a conductive material in the trenches. According to an embodiment, the method may further comprise etching back a portion of the conductive material in the trenches. For example, forming the gate electrode may comprise forming an insulating layer over the portion of the conductive layer, the insulating layer lining sidewalls of the trenches, and forming a gate conductive layer over the insulating layer. According to an embodiment, forming the semiconductor device may further comprise forming a field plate (S35).

Figure 7:
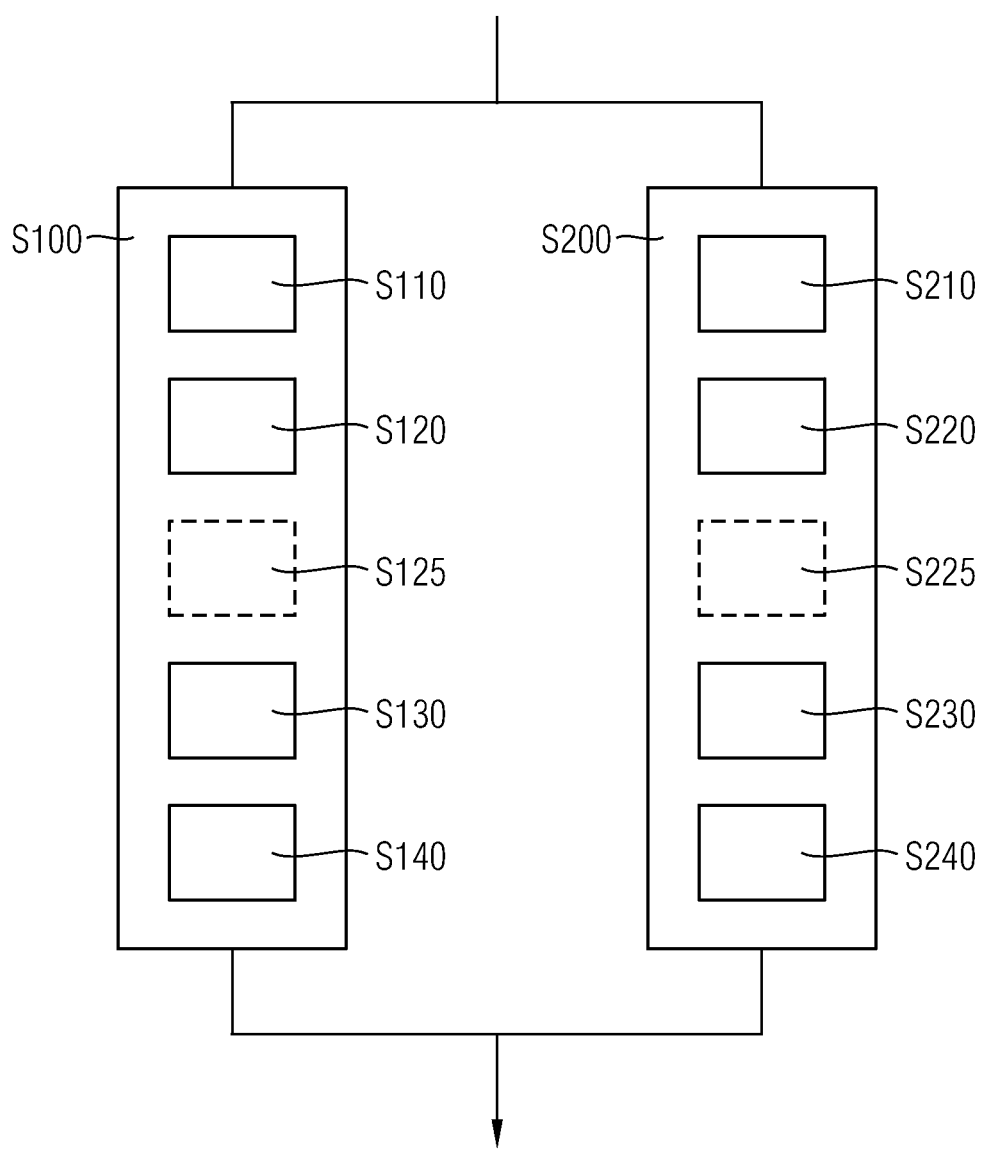
FIG. 7 shows a flow diagram of a method for manufacturing an integrated circuit according to an embodiment.

Further, FIG. 7 summarizes elements of a method of manufacturing an integrated circuit. As is shown, forming an integrated circuit may comprise forming a first transistor (S100) and forming a second transistor (S200) in a semiconductor substrate having a first main surface. Forming the first transistor may comprise: forming a first source region (S140); forming a first drain region (S140); forming a first channel region (S110); forming a first drift zone (S120); and forming a first gate electrode (S130) in trenches extending in a first direction parallel to the first main surface, the first gate electrode being formed so as to be disposed adjacent to at least two sides of the channel region. Forming the first channel region and forming the first drift zone may be accomplished so that they are disposed along the first direction between the first source region and the first drain region. Further, forming the second transistor (S200) comprises: forming a second source region (S240); forming a second drain region (S240); forming a second channel region (S210); forming a second drift zone (S220); and forming a second gate electrode (S230), wherein the second channel region and the second drift zone are disposed along a second direction between the second source region and the second drain region, the second drain region extending perpendicularly with respect to the first main surface. According to an embodiment, forming the first transistor (S100) may further comprise forming a conductive layer (S125), a portion of the conductive layer being disposed in the semiconductor substrate beneath the first gate electrode and being insulated from the first gate electrode. According to an embodiment, forming the second transistor (S200) may further include forming a second field plate (S225) so as to be arranged adjacent to the second drift zone.

According to an embodiment, the method may further comprise forming trenches in the first main surface. Forming the portion of the conductive layer may comprise forming a conductive material in the trenches. According to an embodiment, the method may further comprise etching back a portion of the conductive material in the trenches. For example, forming the first gate electrode may comprise forming an insulating layer over the portion of the conductive layer, the insulating layer lining sidewalls of the trenches, and forming a gate conductive layer over the insulating layer.

According to an embodiment, forming the first semiconductor device may further comprise forming a first field plate.

According to an embodiment, elements of the first transistor and elements of the second transistor may be formed by joint processing processes. For example, forming the trenches for forming the first gate electrode and forming the trenches for forming the second gate electrode may comprise joint etching processes using different masks. Further, forming the conductive layer and forming the second field plate may comprise joint methods of forming a conductive layer. Further, forming the first gate electrode and forming the second gate electrode may comprise joint methods of forming a conductive layer.

Figure 8A:
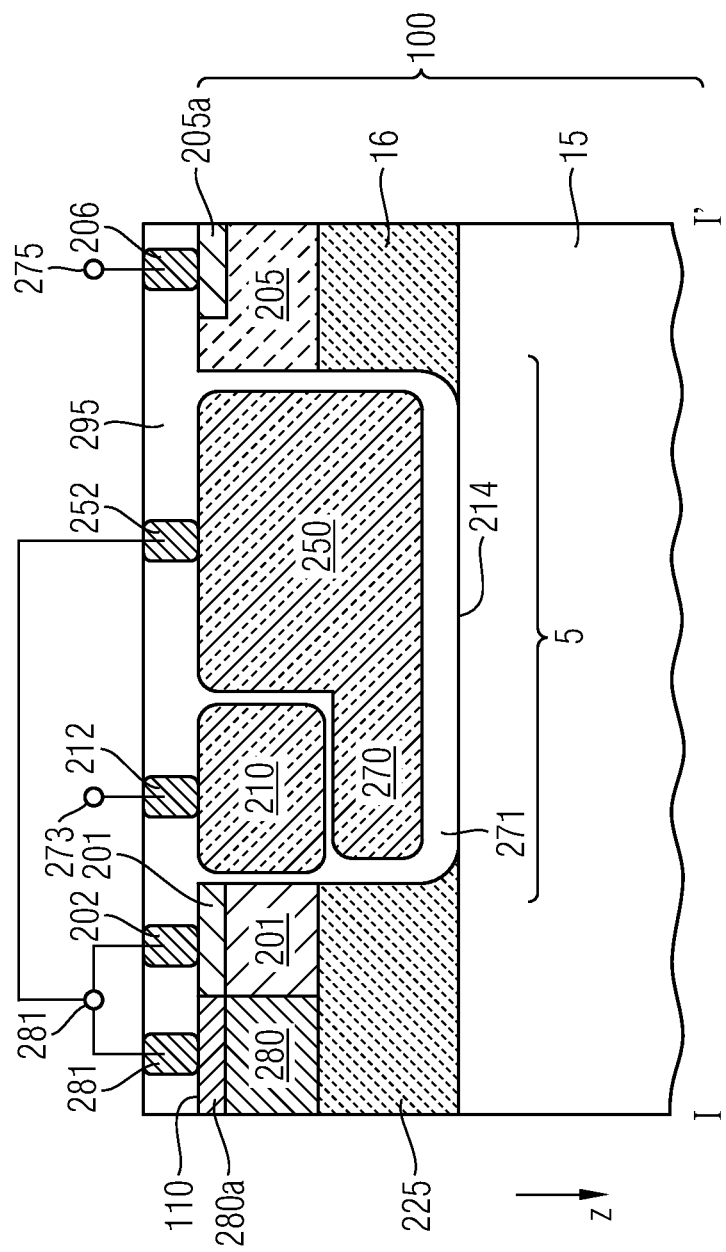
FIG. 8A shows a cross-sectional view of a semiconductor device according to a further embodiment.
Figure 8B:
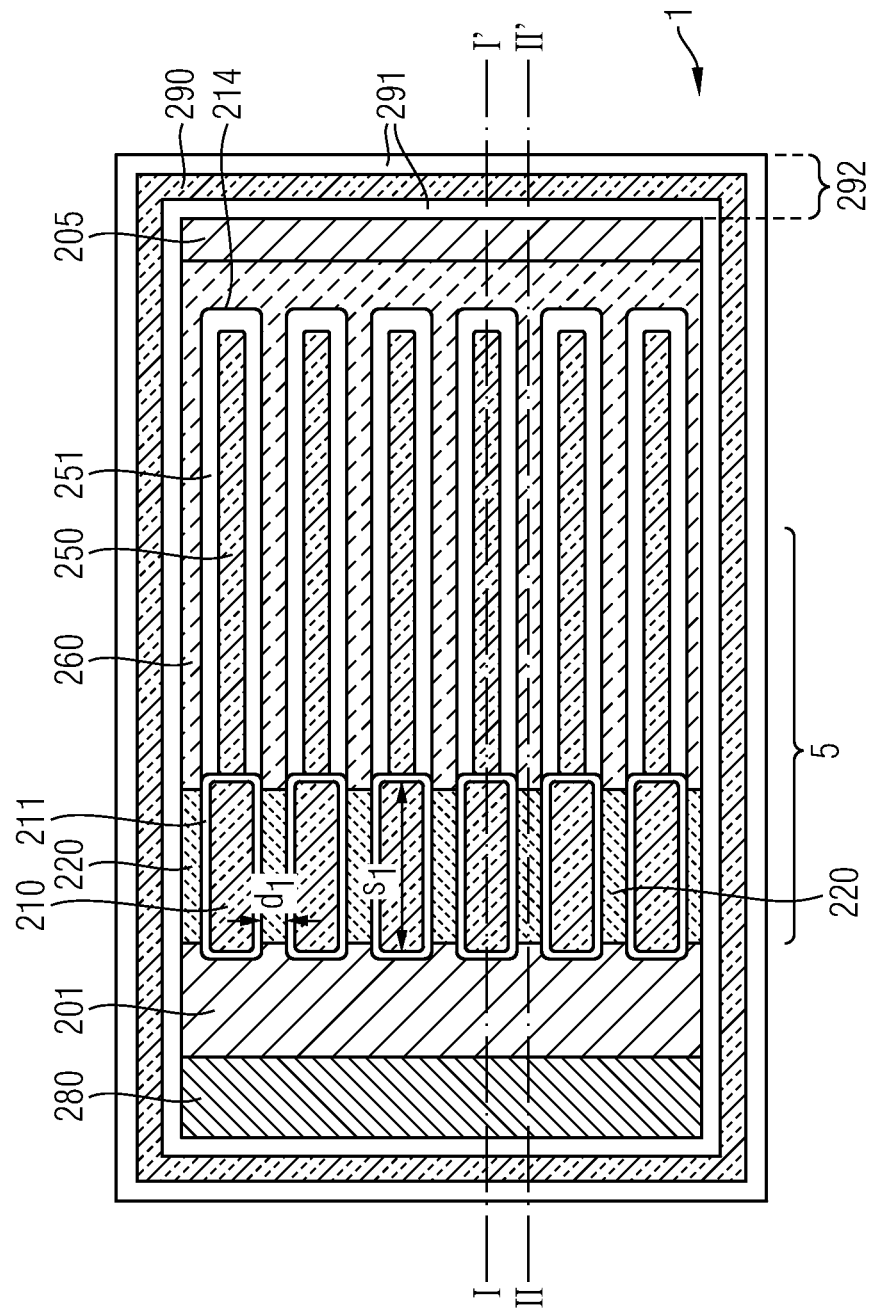
FIG. 8B shows a horizontal cross-sectional view of the embodiment.
Figure 8C:
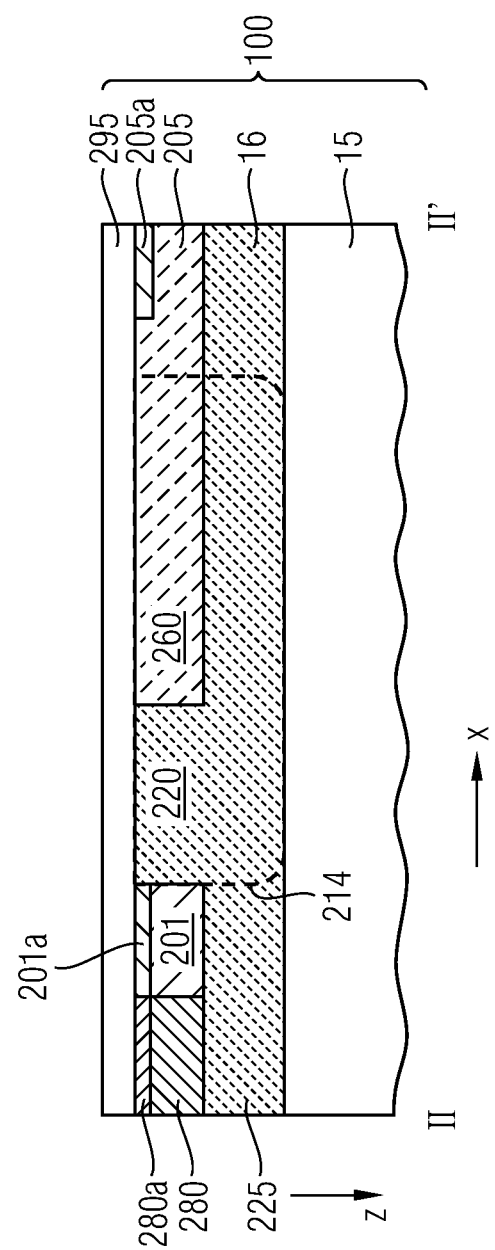
FIG. 8C shows a further cross-sectional view of the embodiment.

FIGS. 8A to 8C show various views of a semiconductor device according to a further embodiment. The following description will focus on the differences between the present embodiment and the embodiment shown in FIGS. 1 to 3C. Accordingly, unless otherwise stated, the semiconductor device comprises the components that have been described with reference to FIGS. 1 to 3C.

FIG. 8A shows a cross-sectional view of a semiconductor device between I and I' as is also shown in FIG. 8B. The cross-sectional view is taken so as to intersect the gate electrode 210 and the field plate 250. The semiconductor device shown in FIG. 8A comprises a transistor 5 in a semiconductor substrate having a first main surface 110. The transistor 5 comprises a source region 201, a drain region 205, a channel region, a drift zone and a gate electrode 210 adjacent to at least two sides of the channel region. The channel region and the drift zone are disposed along a first direction parallel to the first main surface. The semiconductor device further comprises a field plate 250 adjacent to at least two sides of the drift zone. The gate electrode is disposed in a trench extending in the first direction. The semiconductor device further comprises a conductive layer 270 beneath the gate electrode 210 and insulated from the gate electrode 210. The conductive layer is electrically connected to the field plate 250. For example, the gate electrode, the field plate 250 and the conductive layer may be disposed in a common trench 214 that extends in the first direction. (e.g. the x-direction). The field plate 250 may be formed at the first main surface 110 of the semiconductor substrate 100. The gate electrode 210 and the field plate 250 may be arranged one behind the other along the first direction.

As is shown in FIG. 8A, the gate electrode 210 may be disposed at the left-hand side of the trench 214 so as to be in contact with the source region 201. The conductive layer 270 may be insulated from the adjacent semiconductor material by means of the dielectric layer 271. Further, a gate dielectric layer 211 may be disposed between the gate electrode 210 and the adjacent conductive material of the field plate 250, of the conductive layer 270, the source region 201 and the adjacent channel region 220. The source region 201 may extend in a depth direction (e.g. the z-direction) approximately to a depth that corresponds to a depth of the gate electrode 210. The field plate 250 may be connected via a field plate contact plug 252 to an appropriate terminal, e.g. a source terminal 274. Accordingly, the conductive layer 270 is electrically connected via the field plate 250 to the source terminal 274.

In a similar manner as has been discussed with reference to FIG. 1, an isolation trench 292 may surround the array of lateral transistors. In a similar manner, also not shown in FIG. 8A, an insulating material 291 may be disposed at sidewalls of the isolation trench, and a conductive filling may be disposed within the isolation trench. The transistor may implement a field effect transistor.

FIG. 8B shows a horizontal cross-sectional view of a semiconductor device. As is shown, differing from the embodiment shown in FIG. 1, the gate electrode 210 extends to the left-hand side of the trenches 214, respectively. The gate electrode 210 contacts the source region 201 that continuously extends in a third direction (e.g. the y-direction) parallel to the first main surface. Further, the field plate 250 may be disposed in the trenches 214. Accordingly, a pitch between adjacent field plates may be identical to the pitch between adjacent gate electrodes 210. The channel region 220 is patterned into the shape of a ridge extending in the first direction by adjacent trenches 214. In a similar manner, the drift zone 260 is patterned into ridges extending in the first direction by the trenches 214. A field dielectric layer 251 is disposed between the field plate 250 and the adjacent drift zone 260. A thickness of the field dielectric layer 251 may be larger than a thickness of a gate dielectric layer 211 that is arranged between the gate electrode 210 and the adjacent channel region 220. FIG. 8B also shows the isolation trench 292 including the insulating layer 291 and the conductive filling 290.

FIG. 8C shows a cross-sectional view that is taken between II and II' in FIG. 8B. The cross-sectional view of FIG. 8B is taken so as to intersect the channel region and the drift zone. As is shown, a doped portion 225 is connected via the body contact portion 280 and the contact region 280a to the body contact plug 281 (shown in FIG. 8A). The body contact portion 225 may connect the channel region 220 to a terminal (e.g. the source terminal 274) that is electrically connected to the body contact plug 281. The source region 201 extends to a depth that is less than the depth of the trench 214. To be more specific, the source region is not adjacent to the conductive layer 270 formed in the lower portion of the trench 214.

Figure 9:
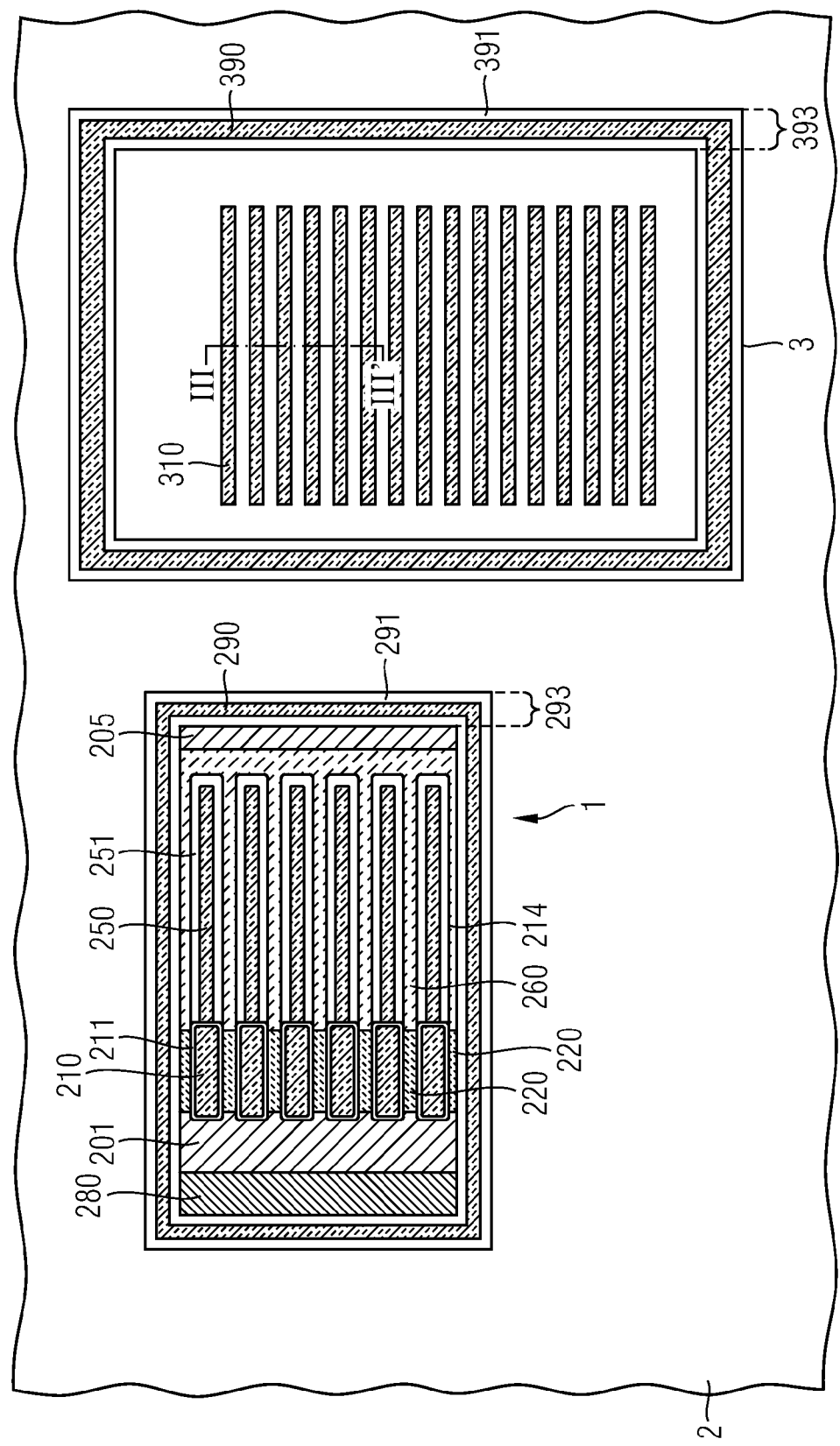
FIG. 9 shows a horizontal cross-sectional view of an integrated circuit according to an embodiment.

FIG. 9 shows a horizontal cross-sectional view of an integrated circuit comprising the semiconductor device that has been explained with reference to FIGS. 8A to 8C and a second semiconductor device 3 including vertical power transistors. According to the embodiment shown in FIG. 9, the gate electrode 210 and the field plate 250 are disposed in a trench 214. The conductive layer beneath the gate electrode 210 is electrically coupled to the field plate 250. The source region 201 is disposed adjacent to the gate electrode 210. The further components of the integrated circuit are similar to the respective components of the integrated circuit shown in FIG. 4A. Further, a cross-sectional view of the second semiconductor device is identical to the cross-sectional view shown in FIG. 4B.

The semiconductor device 1 shown in FIGS. 8A to 8C or the integrated circuit 2 shown in FIG. 9 may be manufactured by a method comprising similar steps as the method illustrated in FIGS. 5A to 5H and explained in FIGS. 6 and 7. However, differing from the method illustrated in FIGS. 5A to 5E, the mask shown in FIG. 5D is modified so as to provide a single mask opening for defining the gate trenches and the field plate trenches. Further, when performing the etching process, differing from the cross-sectional view shown in FIG. 5C, the trenches 560 and 565 are merged to form one single trench for forming the gate electrode and the field plate. Further, when forming the recess 563 as illustrated in FIG. 5, the mask including openings 575 is aligned, so that a left-side only is flush with the left-side etch of the trench 214. As a result, when recessing the conductive material and the insulating material and, subsequently forming the gate dielectric layer and the gate electrode 210, the gate electrode 210 is disposed on the left-hand side of the trench 214, adjacent to the source region 201.

Figure 10A:
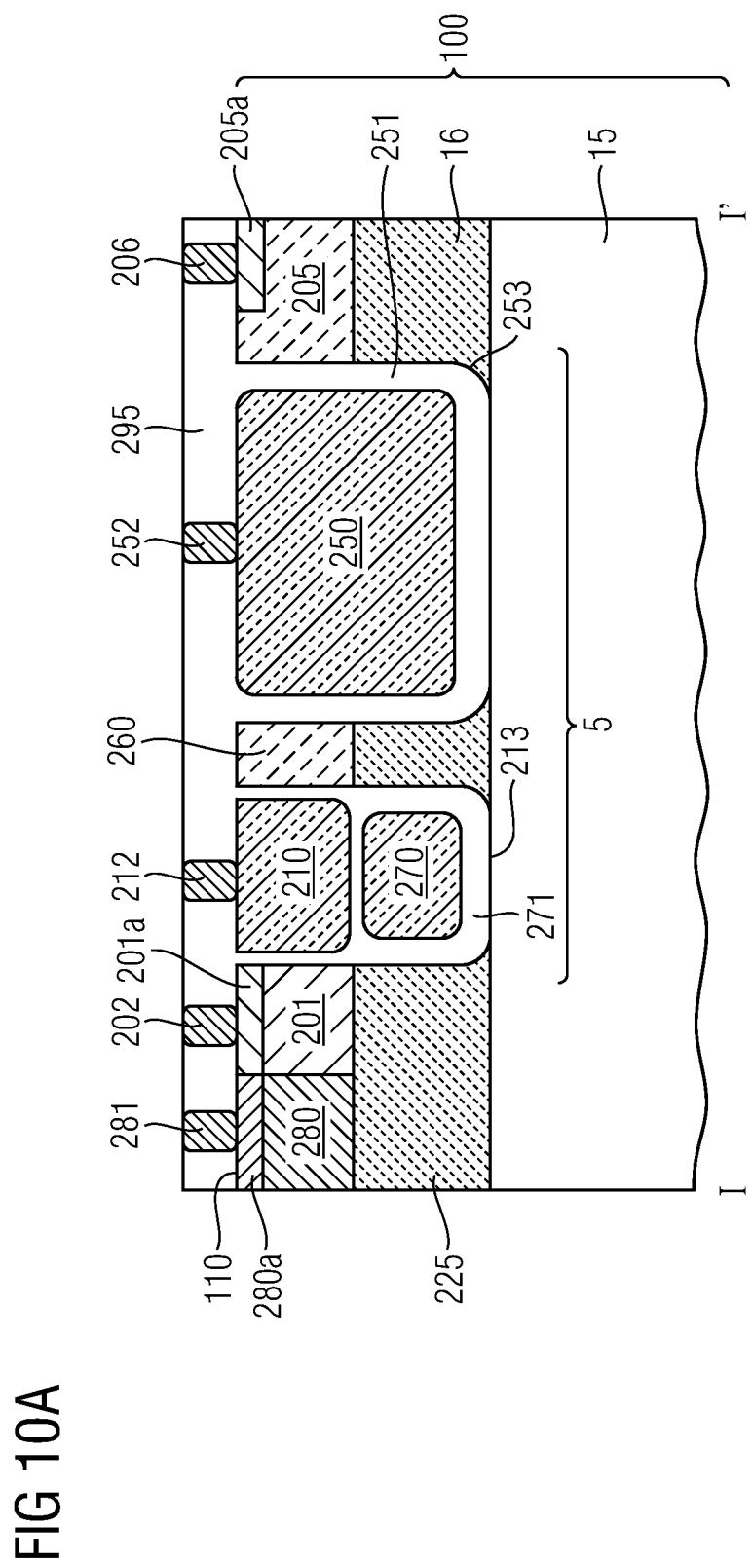
FIG. 10A shows a cross-sectional view of a semiconductor device according to an embodiment.
Figure 10B:
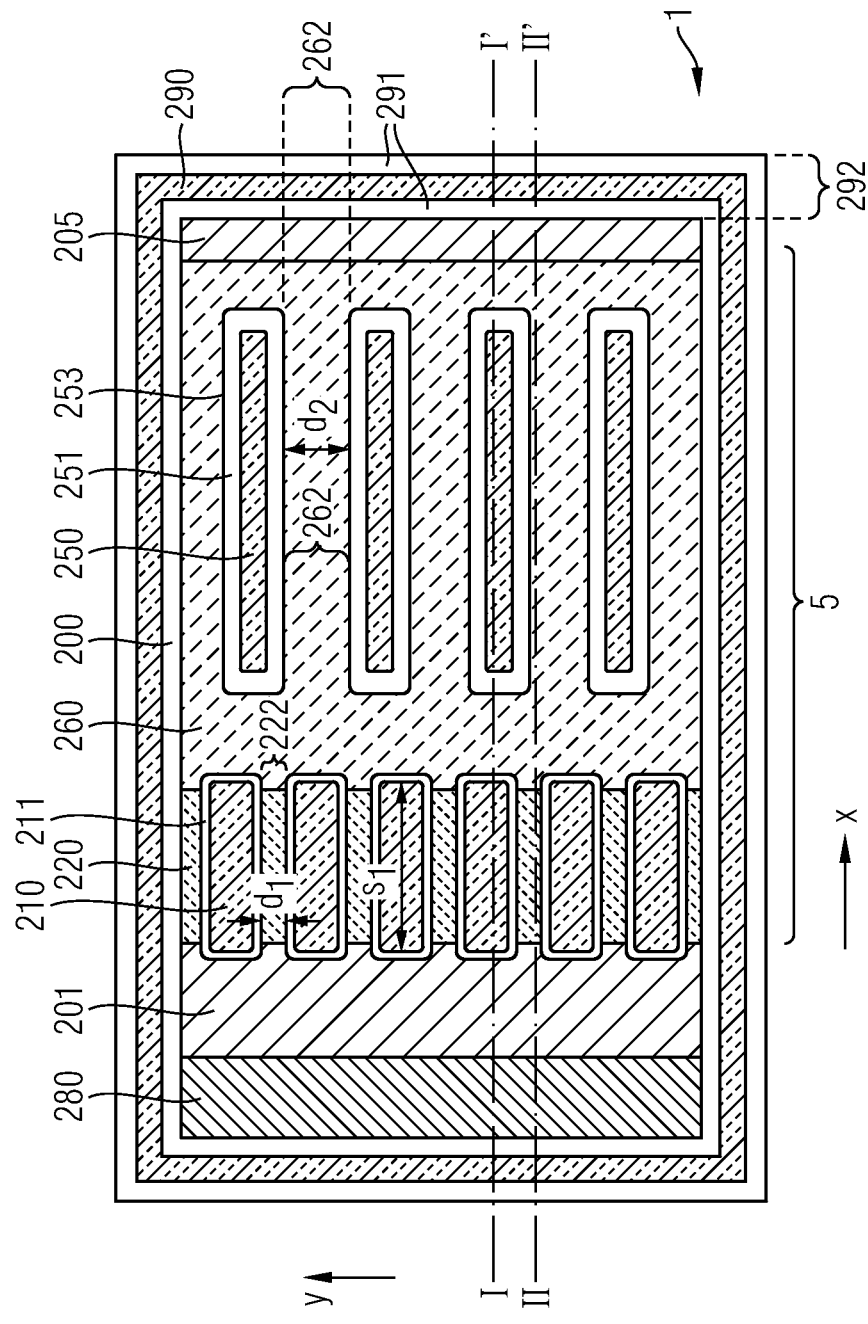
FIG. 10B shows a horizontal cross-section view of the semiconductor device.
Figure 10C:
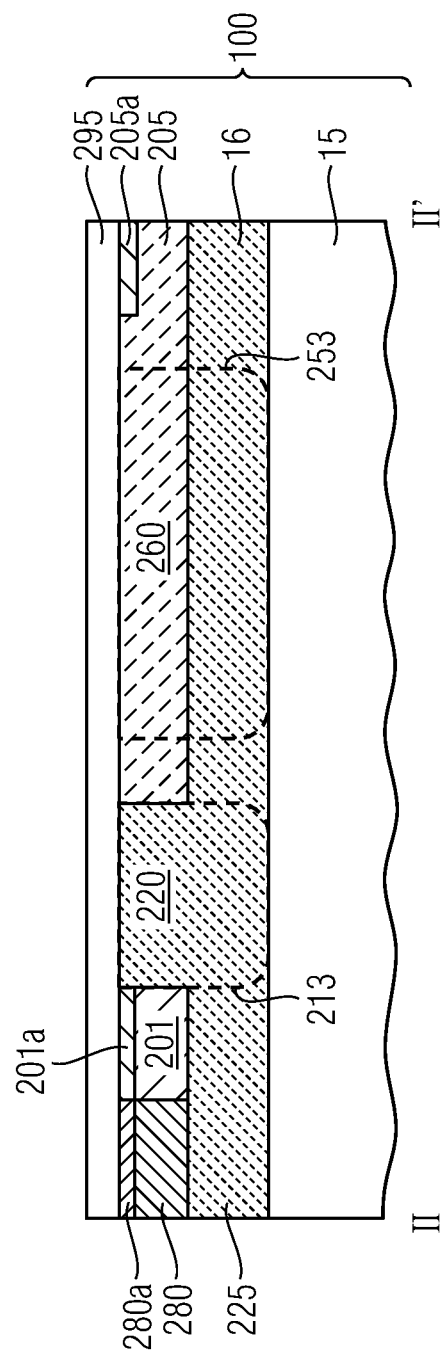
FIG. 10C shows a further cross-sectional view of the semiconductor device.

FIGS. 10A to 10C show a further embodiment of the semiconductor device. The description of this embodiment will focus on the differences between the present embodiment and the embodiment shown in FIGS. 1 to 3C. The semiconductor device 1 shown in FIG. 10A to 10C comprises a transistor 5 in a semiconductor substrate 100 having a first main surface 110. The transistor 5 comprises a source region 201, a drain region 205, a channel region 220, a drift zone 260 and a gate electrode 210 adjacent to at least two sides of the channel region 220. The channel region 220 and the drift zone 260 (both illustrated in FIG. 10C) are disposed along a first direction (e.g. the x-direction) parallel to the first main surface 110 between the source region 201 and the drain region 205. The semiconductor device further comprises a conductive layer beneath the gate electrode and insulated from the gate electrode 210. The gate electrode 210 and the conductive layer 270 are disposed in a trench 213 extending in the first direction. The conductive layer 270 is disconnected from a gate terminal and from a source terminal. According to the embodiment shown in FIGS. 10A to 10C, the semiconductor device 1 may optionally comprise a field plate 250. The field plate 250 may be disposed in a field plate trench. The field plate trench 253 and the gate trench 213 may be separate trenches. In particular, a pitch between adjacent field plate trenches 253 may be different from a pitch between adjacent gate trenches 213. The transistor may implement a field effect transistor.

FIG. 10A shows a cross-sectional view of a semiconductor device. The cross-sectional view of FIG. 10A is taken between I and I', as is also illustrated in FIG. 10B. As is shown, the gate electrode 210 and the conductive layer 270 are disposed in a gate trench 213. The gate electrode 210 and the conductive layer 270 are insulated from each other. The conductive layer is insulated from adjacent semiconductor material by means of an insulating layer 271. The conductive layer 270 may be completely buried in the gate trench 213, and no portion of the conductive layer 270 may be disposed at the first main surface 110 of the semiconductor substrate. According to an interpretation, the conductive layer 270 implements a floating body that is held at an undefined potential. Due to the thick insulating layer 271, the conductive layer 270 may not largely influence the adjacent semiconductor material. For example, a layer thickness of the insulating layer 271 may be approximately 50 to 500, the layer thickness depending on the desired blocking voltage.

FIG. 10B shows a horizontal cross-sectional view of the semiconductor device. As is shown, a portion of the source region 201, that extends in a third direction parallel to the first main surface 110, is disposed adjacent to the gate electrode 210. The gate trenches 213 and the field plate trenches 253 may be disposed at different pitches. Accordingly, the channel region 220 may be patterned into the shape of a ridge by adjacent gate trenches 213. Likewise, the drift zone 260 may be patterned into second ridges 262 by means of the field plate trenches 253. A width $d_2$ of the second ridges 262 may be larger than the width $d_1$ of the first ridges 222. The width may be measured in a second direction perpendicular to the first direction.

FIG. 10C shows a cross-sectional view between II and II', as is also illustrated in FIG. 10B. The cross-sectional view of FIG. 10C is taken so as to intersect the channel region 220 and the drift zone 260. The gate trench 213 and the field plate trench 253 are disposed before of behind the depicted plane of the drawing.

Figure 11:
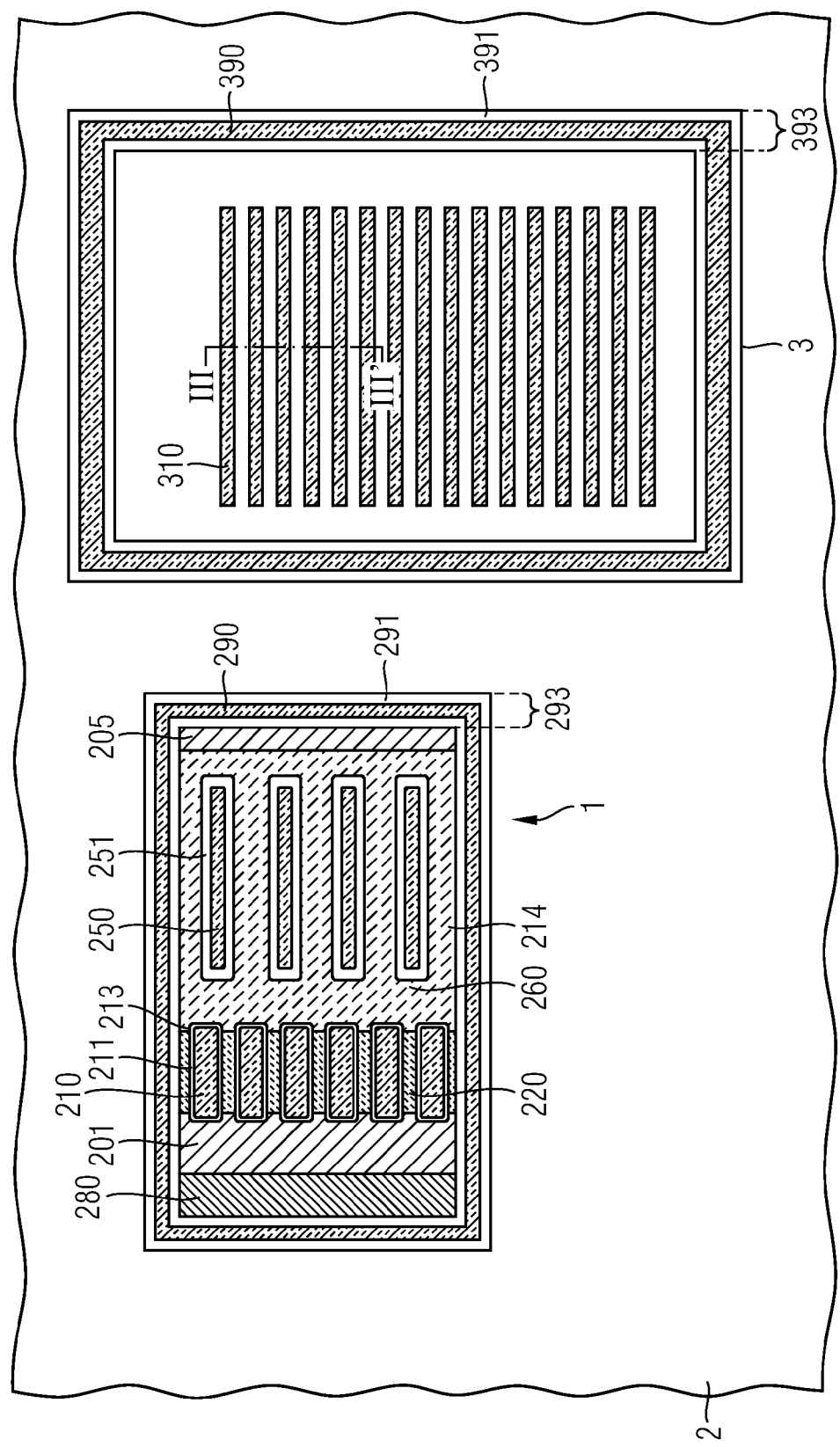
FIG. 11 shows a horizontal cross-sectional view of an integrated circuit according to an embodiment.

FIG. 11 shows a horizontal plan view of an integrated circuit comprising the semiconductor device 1 that has been explained with reference to FIGS. 10A to 10C. In FIG. 11, the same components as those illustrated in FIG. 4A are designated by corresponding reference numerals. The following description will focus on the differences between FIG. 11 and FIG. 4A. The further components are similar or identical as those shown in FIG. 4A. Differing from the embodiment shown in FIG. 4A, according to the embodiment of FIG. 11, the semiconductor device 1 is implemented in the manner as has been described with reference to FIGS. 10A to 10C. The gate electrode 210 extends from the left-hand side to the right-hand side of the gate trenches 213. Further, the conductive layer 270 beneath the gate electrode 210 is disconnected from a source terminal or a gate terminal. Accordingly, the conductive layer 270 is not connected to the field plate 250, nor is it connected to the gate electrode 210. The conductive layer 270 is entirely disposed beneath the gate electrode 210, so that no portion of the conductive layer 270 is present at the first main surface 110.

The remaining components of the semiconductor device 1 are identical to those illustrated in FIGS. 10A to 10C. Further, a cross-sectional view between III and III' is identical to the cross-sectional view shown in FIG. 4B.

The semiconductor device shown in FIGS. 10A to 10C or the integrated circuit 2 shown in FIG. 11 may be manufactured by a method comprising similar steps as the method illustrated in FIGS. 5A to 5H and explained in FIGS. 6 and 7. However, differing from the method illustrated in FIGS. 5A to 5E, the mask 570 shown in FIG. 5G may be modified. As a consequence during the etching step for recessing the conductive material 562 in the trenches 560, the conductive material is removed from the entire lateral extension of the upper part of the trenches 560. For example, this may be accomplished by using a mask 570 having openings 575 that correspond to the openings 574 of the mask 570 shown in FIG. 5D. As a result the remaining conductive material 562 in the trenches 560 may have a horizontal surface. Thereafter, an insulating material 568 is formed so as to provide the gate dielectric layer 211, followed by a conductive layer 569 that forms the gate electrode 210.

Figure 12:
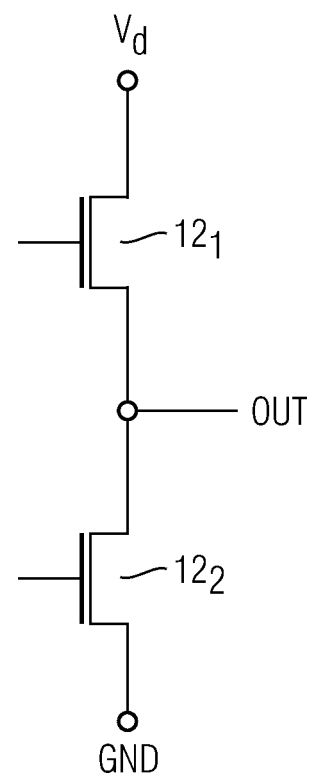
FIG. 12 shows an implementation of an integrated circuit according to an embodiment.

FIG. 12 shows an implementation of an integrated circuit as illustrated in any of FIGS. 4A and 4B, 9 and 11. The integrated circuit comprises a first transistor 121 (also referred to as a "high-side" transistor) and a second transistor 122 (also referred to as a "low-side" transistor). The source terminal of the first transistor 121 and the drain terminal of the second transistor 122 are electrically connected to a common OUT-terminal. The drain-terminal of the first transistor 121 may be connected to a battery and the source terminal of the second transistor 122 may be connected to a ground potential. The first transistor 121 may be implemented as a vertical transistor, i.e. as the second transistor shown in FIGS. 4A, 4B, 9, and 11. The second transistor 122 may be implemented as a lateral transistor that is, e.g. illustrated in FIGS. 1 to 3, 8 and 10. The integrated circuit shown in FIG. 12 implements a half-bridge. Due to the feature that the second transistor is implemented as a lateral transistor comprising a drain region at the first main surface, the first and the second transistors may be easily integrated in a single semiconductor substrate. Further, the manufacturing process may be simplified since components of the first and the second transistors may be formed by joint or common processing steps. The integrated circuit shown in FIGS. 4A, 4B, 9, 11 and 12 may be utilized in an electromotor or in a DC-DC converter. Further embodiments relate to an electromotor or a DC-DC converter comprising the half-bridge shown in FIG. 12 or the integrated circuit illustrated in any of FIGS. 4A, 9, and 11.

While embodiments of the invention have been described above, it is obvious that further embodiments may be implemented. For example, further embodiments may comprise any subcombination of features recited in the claims or any subcombination of elements described in the examples given above. Accordingly, this spirit and scope of the appended claims should not be limited to the description of the embodiments contained herein.

What is claimed is:

1. A semiconductor device comprising a transistor in a semiconductor substrate having a first main surface, the transistor comprising:
    a source region;
    a drain region;
    a channel region;
    a drift zone; and
    a gate electrode adjacent to at least two sides of the channel region, the gate electrode being disposed in gate trenches extending in a first direction parallel to the first main surface, the gate electrode being electrically coupled to a gate terminal, the channel region and the drift zone being disposed along the first direction between the source region and the drain region,
    the semiconductor device further comprising a conductive layer beneath the gate electrode and insulated from the gate electrode, the conductive layer being electrically connected to the gate terminal.

2. The semiconductor device according to claim 1, wherein a portion of the conductive layer is disposed adjacent to the first main surface.

3. The semiconductor device according to claim 1, wherein the conductive layer is disposed in the gate trenches.

4. The semiconductor device according to claim 1, further comprising a field plate arranged adjacent to the drift zone, the field plate being disposed at the first main surface.

5. The semiconductor device according to claim 1, wherein the channel region has a shape of a first ridge extending in the first direction.

6. The semiconductor device according to claim 5, wherein a portion of the drift zone has a shape of a second ridge extending along the first direction.

7. The semiconductor device according to claim 6, wherein the second ridge has a width different from a width of the first ridge.

8. The semiconductor device according to claim 5, wherein $s/d>2.0$, wherein s denotes a length of the first ridge measured along a first direction, and wherein d denotes a width of the first ridge.

9. An integrated circuit comprising the semiconductor device according to claim 1, and
    a second transistor comprising:
        a second source region;
        a second drain region;
        a second channel region;
        a second drift zone;
        a second gate electrode, and
        a second field plate adjacent to the second drift zone,
        the second channel region and the second drift zone being disposed along a second direction between the second source region and the second drain region, the second direction extending perpendicularly with respect to the first main surface.

10. The integrated circuit of claim 9, wherein the integrated circuit implements a half-bridge.

11. A semiconductor device comprising a transistor in a semiconductor substrate having a first main surface, the transistor comprising:
    a source region;
    a drain region;
    a channel region;
    a drift zone; and
    a gate electrode adjacent to at least two sides of the channel region, a field plate adjacent to at least two sides of the drift zone, the gate electrode being disposed in trenches extending in a first direction parallel to the first main surface,
    the channel region and the drift zone being disposed along the first direction between the source region and the drain region,
    the semiconductor device further comprising a conductive layer beneath the gate electrode and insulated from the gate electrode, the conductive layer being electrically connected to the field plate.

12. The semiconductor device according to claim 11, wherein the conductive layer and the field plate are disposed in gate trenches formed in the first main surface of the semiconductor substrate.

13. The semiconductor device according to claim 12, wherein the field plate is disposed at the first main surface and extends in a vertical direction from the first main surface.

14. The semiconductor device according to claim 12, wherein adjacent gate trenches pattern the channel region and the drift zone into a shape of a ridge extending in the first direction.

15. An integrated circuit comprising the semiconductor device according to claim 11, and
    a second transistor comprising:
        a second source region;
        a second drain region;
        a second channel region;
        a second drift zone;
        a second gate electrode, and
        a second field plate adjacent to the second drift zone, the second channel region and the second drift zone being disposed along a second direction between the second source region and the second drain region, the second direction extending perpendicularly with respect to the first main surface.

16. The integrated circuit of claim 15, wherein the integrated circuit implements a half-bridge.

\* \* \* \* \*